(12) United States Patent
Kim et al.

(10) Patent No.: US 12,538,692 B2
(45) Date of Patent: Jan. 27, 2026

(54) DISPLAY APPARATUS AND METHOD OF MANUFACTURING DISPLAY APPARATUS

(71) Applicant: Samsung Display Co., Ltd., Yongin-si (KR)

(72) Inventors: Seungwan Kim, Yongin-si (KR); Dongwon Han, Yongin-si (KR); Jaecheol Lee, Yongin-si (KR); Seok Chu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 735 days.

(21) Appl. No.: 17/879,596

(22) Filed: Aug. 2, 2022

(65) Prior Publication Data

US 2023/0079173 A1 Mar. 16, 2023

(30) Foreign Application Priority Data

Sep. 13, 2021 (KR) ........................ 10-2021-0122074

(51) Int. Cl.
*H10K 59/80* (2023.01)
*H10K 59/122* (2023.01)
*H10K 71/00* (2023.01)

(52) U.S. Cl.
CPC ......... *H10K 59/873* (2023.02); *H10K 59/122* (2023.02); *H10K 71/00* (2023.02)

(58) Field of Classification Search
None
See application file for complete search history.

(56) References Cited

U.S. PATENT DOCUMENTS

| 9,166,166 | B2 | 10/2015 | Kim et al. | |
| 10,021,741 | B2 * | 7/2018 | Lee | H05B 33/04 |
| 10,312,299 | B2 | 6/2019 | Jun et al. | |
| 2023/0009760 | A1 * | 1/2023 | Kim | H10K 59/8731 |

FOREIGN PATENT DOCUMENTS

| CN | 111665975 B | * | 4/2024 | ........... G06F 1/1626 |
| CN | 118804628 A | * | 10/2024 | ....... G02F 1/133305 |
| JP | 2009154409 A | | 7/2009 | |
| KR | 10-1257801 B1 | | 4/2013 | |
| KR | 10-2016-0038663 A | | 4/2016 | |
| KR | 20160072643 A | * | 6/2016 | |
| KR | 1020160038663 | * | 7/2016 | |
| KR | 20170106621 A | * | 9/2017 | |
| KR | 10-2018-0014397 A | | 2/2018 | |
| KR | 1020180014397 | * | 8/2018 | |
| KR | 10-2019-0078218 A | | 7/2019 | |
| KR | 10-2081285 B1 | | 2/2020 | |
| KR | 10-2020-0036291 A | | 4/2020 | |
| KR | 10-2133421 B1 | | 7/2020 | |
| KR | 10-2021-0031067 A | | 3/2021 | |
| KR | 10-2021-0049323 A | | 5/2021 | |
| KR | 20240102102 A | * | 7/2024 | |

* cited by examiner

*Primary Examiner* — Michael Lebentritt
(74) *Attorney, Agent, or Firm* — Womble Bond Dickinson (US) LLP

(57) ABSTRACT

A display apparatus including a display area and a peripheral area surrounding the display area, the display apparatus including: a substrate; a plurality of display elements over the substrate in the display area; an inorganic encapsulation layer sealing the plurality of display elements; and an organic encapsulation layer covering the inorganic encapsulation layer and including a protrusion protruding in a stack direction at an end thereof.

20 Claims, 20 Drawing Sheets

DISPLAY APPARATUS AND METHOD OF MANUFACTURING DISPLAY APPARATUS

CROSS-REFERENCE TO RELATED APPLICATION

The present application claims priority to and the benefit of Korean Patent Application No. 10-2021-0122074, filed on Sep. 13, 2021, in the Korean Intellectual Property Office, the entire disclosure of which is incorporated herein by reference.

BACKGROUND

1. Field

Aspects of one or more embodiments relate to a display apparatus and a method of manufacturing a display apparatus.

2. Description of the Related Art

Electronic apparatuses may be utilized in various mobile electronic apparatuses and non-mobile electronic apparatuses. To support various functions, electronic apparatuses generally include a display apparatus that may provide a user with visual information such as images.

A display apparatus visually displays data and may include a display area and a peripheral area outside the display area, the display area displaying images. Pixels are arranged in the display area, and a driving circuit, a power wiring, and the like may be arranged in the peripheral area. The peripheral area is a region from which light is not emitted and may be a dead space.

Recently, as the purposes and uses of display apparatuses have become more diversified, various designs that improve the quality of display apparatuses have been attempted. For example, efforts have been made to develop various display apparatuses having excellent characteristics such as being relatively thin and lightweight, and having relatively low power consumption. Research for reducing a dead space and extending the area of a display area of a display apparatus is in active progress.

The above information disclosed in this Background section is only for enhancement of understanding of the background and therefore the information discussed in this Background section does not necessarily constitute prior art.

SUMMARY

Aspects of one or more embodiments relate to a display apparatus and a method of manufacturing a display apparatus, and for example, to a display apparatus and a method of manufacturing a display apparatus, wherein an organic encapsulation layer itself forms a dam and thus a dead space may be reduced.

One or more embodiments include a display apparatus and a method of manufacturing a display apparatus, wherein an organic encapsulation layer itself forms a dam and thus a dead space may be relatively reduced.

However, such a technical problem is an example, and embodiments according to the present disclosure are not limited thereto.

Additional aspects will be set forth in part in the description which follows and, in part, will be apparent from the description, or may be learned by practice of the presented embodiments of the disclosure.

According to one or more embodiments, a display apparatus including a display area and a peripheral area surrounding the display area includes a substrate, a plurality of display elements arranged over the substrate and arranged in the display area, an inorganic encapsulation layer sealing the plurality of display elements, and an organic encapsulation layer covering the inorganic encapsulation layer and including a protrusion protruding in a stack direction at an end thereof.

According to some embodiments, the display apparatus may further include a planarization layer between the substrate and the inorganic encapsulation layer, wherein the protrusion may be arranged in a region in which the planarization layer is arranged.

According to some embodiments, the organic encapsulation layer may be arranged within a region in which the planarization layer is arranged on a plane when viewed in a direction perpendicular to a stack surface of the substrate.

According to some embodiments, a minimum distance between one surface of the substrate and the organic encapsulation layer may be greater than a maximum distance between one surface of the substrate and the planarization layer.

According to some embodiments, a height of the protrusion may be 3 µm or more and less than 10 µm.

According to some embodiments, the display apparatus may further include a pixel-defining layer between the substrate and the inorganic encapsulation layer, wherein the protrusion may overlap the pixel-defining layer on a plane when viewed in a direction perpendicular to a stack surface of the substrate.

According to some embodiments, the protrusion may be provided in a closed-loop along a periphery of the display area.

According to one or more embodiments, a method of manufacturing a display apparatus includes forming an inorganic encapsulation layer to cover a display area over a substrate including the display area in which a plurality of display elements are arranged, discharging droplets in a first region of the inorganic encapsulation layer, hardening the droplets in the first region, discharging droplets in a second region of the inorganic encapsulation layer that surrounds the first region, and hardening the droplets in the second region.

According to some embodiments, the method may further include forming a pixel-defining layer between the substrate and the inorganic encapsulation layer, and discharging droplets such that the first region overlaps the pixel-defining layer in a plane when viewed in a direction perpendicular to a stack surface of the substrate.

According to some embodiments, the method may further include forming an organic encapsulation layer by hardening the droplets in the first region and the droplets in the second region.

According to some embodiments, the first region may be adjacent to a periphery of the display area.

According to some embodiments, the method may further include forming a planarization layer between the substrate and the inorganic encapsulation layer, wherein the first region may be apart inwardly from an outer periphery of the substrate, toward a center of the substrate, to a region in which the planarization layer is arranged.

According to some embodiments, the discharging of the droplets in the first region may include discharging the droplets such that the droplets form a closed-loop.

According to some embodiments, the discharging of the droplets in the first region may include moving a discharge part in one direction to discharge droplets in the first region.

According to some embodiments, the hardening of the droplets in the first region may include hardening the droplets by using a hardening part adjacent to the discharge part.

According to some embodiments, the hardening part may move in a same direction as a moving direction of the discharge part.

According to some embodiments, the hardening part may be arranged at a rear end of the discharge part in a moving direction thereof.

According to some embodiments, the hardening of the droplets in the first region may include hardening the droplets by irradiating, by a hardening part, an ultraviolet ray to the droplets.

According to some embodiments, a blocking part may be provided around the hardening part, the blocking part blocking an ultraviolet ray.

According to some embodiments, the hardening of the droplets in the first region may include selectively irradiating an ultraviolet ray on only the first region in which the droplets are coated.

These and/or other aspects will become apparent and more readily appreciated from the following description of the embodiments, the accompanying drawings, and claims.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
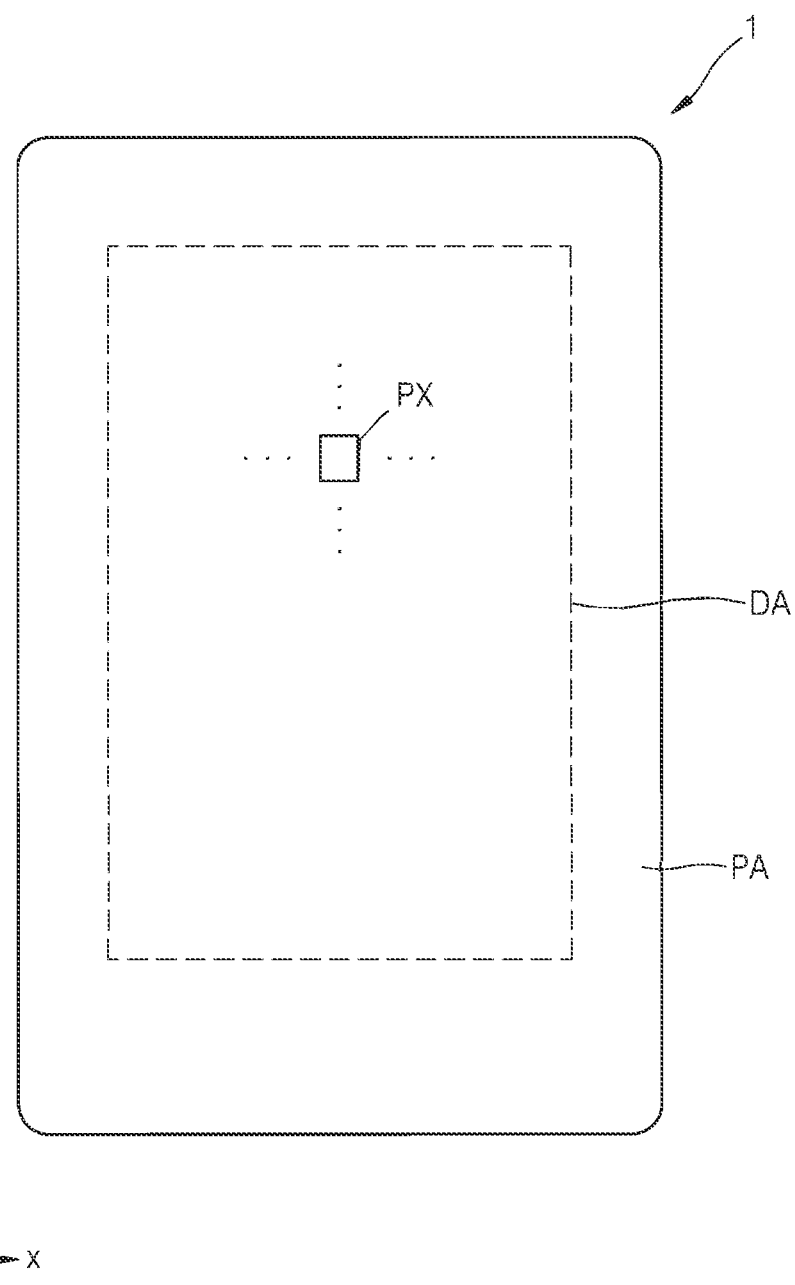
FIG. 1 is a plan view of a display apparatus according to some embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, embodiments according to the present disclosure are not limited to the following embodiments and may be embodied in various forms.

Hereinafter, embodiments of the present disclosure are described in detail with reference to the accompanying drawings. When description is made with reference to the drawings, like reference numerals are used for like or corresponding elements and repeated descriptions thereof are omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. For example, since sizes and thicknesses of elements in the drawings are arbitrarily illustrated for convenience of explanation, embodiments according to the disclosure are not limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In the case where certain embodiments may be implemented differently, a specific process order may be performed in the order different from the described order. As an example, two processes that are successively described may be substantially simultaneously performed or performed in the order opposite to the order described.

FIG. 1 is a plan view of a display apparatus 1 according to some embodiments.

Referring to FIG. 1, the display apparatus 1 may include a display area DA and a peripheral area PA outside the display area DA. A plurality of pixels PX may be arranged in the display area DA. The display area DA may be configured to display a preset image by using light emitted from the plurality of pixels PX. A pixel PX may be defined by an emission area through which a light-emitting element emits light, the light-emitting element being driven by a pixel circuit. Each pixel PX may emit, for example, red, green, or blue light. Alternatively, each pixel PX may emit red, green, blue, or white light. Images may be displayed by light emitted from the pixels PX by a plurality of light-emitting elements.

The peripheral area PA is a region configured not to display images and may be a dead space. The peripheral area PA may be arranged outside the display area DA and may surround the display area DA entirely or partially. A driver and the like may be arranged in the peripheral area PA, the driver and the like being configured to provide electric signals or power to the display area DA. A pad portion may be arranged in the peripheral area PA, the pad portion being a region to which an electronic element, a printed circuit board, or the like may be electrically connected.

Hereinafter, though the display apparatus 1 includes an organic light-emitting diode OLED as a light-emitting element, the display apparatus 1 according to some embodiments is not limited thereto. According to some embodiments, the display apparatus 1 may be a light-emitting display apparatus including an inorganic light-emitting diode, that is, an inorganic light-emitting display apparatus. The inorganic light-emitting diode may include a PN junction diode including inorganic semiconductor-based materials. When a forward voltage is applied to a PN-junction diode, holes and electrons are injected and energy created by recombination of the holes and the electrons is converted to light energy, and thus, light of a preset color may be emitted. The inorganic light-emitting diode may have a width in the range of several micrometers to hundreds of micrometers. According to some embodiments, the inorganic light-emitting diode may be denoted by a micro light-emitting diode. According to some embodiments, the display apparatus 1 may be a quantum-dot light-emitting display apparatus.

As shown in FIG. 1, though the display apparatus 1 may have a quadrangular shape in a plan view, the display apparatus 1 is not limited thereto. The display apparatus 1 may have various shapes such as a polygonal shape such as a triangle, a circular shape, an elliptical shape, an irregular shape, and the like in a plan view. As an example, the display apparatus 1 may have a quadrangular shape having short sides in a first direction (e.g., an x-direction or a (−) x-direction) and long sides in a second direction (e.g., a y-direction or a (−) y-direction). As another example, in the display apparatus 1, the length of the side in the first direction may be the same as the length of the side in the second direction. As another example, the display apparatus 1 may have long sides in the first direction and short sides in the second direction. According to some embodiments, the corner of the display apparatus 1 may be round.

Figure 2:
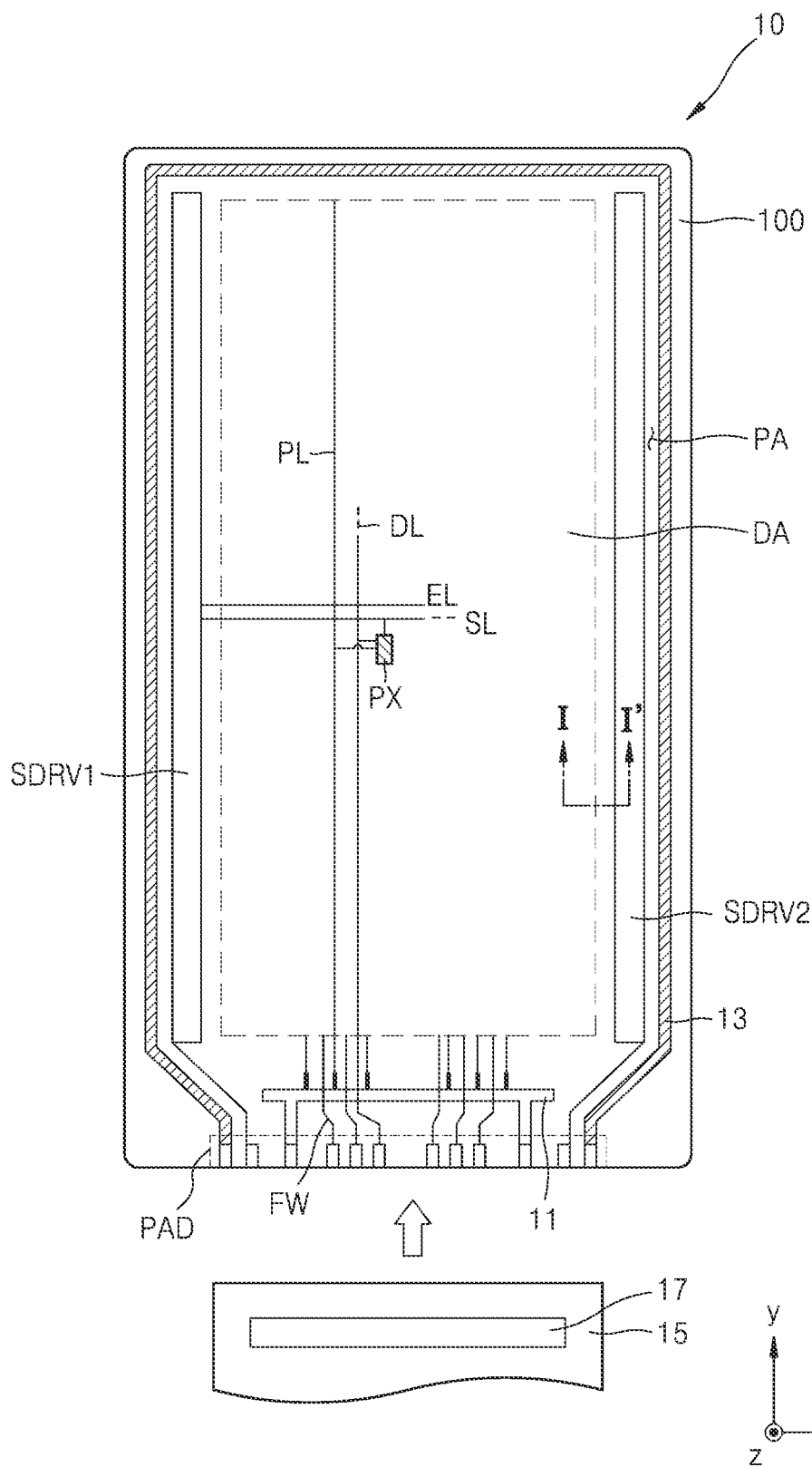
FIG. 2 is a plan view of a display panel that may be included in the display apparatus of FIG. 1.

FIG. 2 is a plan view of a display panel 10 that may be included in the display apparatus 1 of FIG. 1.

Referring to FIG. 2, various kinds of elements constituting the display panel 10 may be arranged over a display substrate 100. The pixels PX may be arranged in the display area DA. The display area DA may be protected from external air or moisture by being covered by an encapsulation member.

The pixel circuits driving the pixels PX may be electrically connected to outer circuits arranged in the peripheral area PA. A first scan driving circuit SDRV1, a second scan driving circuit SDRV2, a terminal part PAD, a driving voltage supply line 11, and a common voltage supply line 13 may be arranged in the peripheral area PA.

The first scan driving circuit SDRV1 may be configured to apply a scan signal to each of the pixel circuits through a scan line SL, the pixel circuits driving the pixels P. The first scan driving circuit SDRV1 may be configured to apply an emission control signal to each of the pixel circuits through an emission control line EL. A second scan driving circuit SDRV2 may be arranged opposite the first scan driving circuit SDRV1 with the display area DA therebetween and approximately parallel to the first scan driving circuit SDRV1. Some of the pixel circuits of the pixels P in the display area DA may be electrically connected to the first scan driving circuit SDRV1, and the others may be electrically connected to the second scan driving circuit SDRV2.

The terminal part PAD may be arranged on one side of the display substrate 100. The terminal part PAD may be exposed and connected to a display circuit board 15 by not being covered by an insulating layer. A display driver 17 may be arranged on the display circuit board 15.

The display driver 17 may be configured to generate a control signal transferred to the first scan driving circuit SDRV1 and the second scan driving circuit SDRV2. The display driver 17 may be configured to generate a data signal, and the generated data signal may be transferred to the pixel circuit of the pixels PX through a fan-out wiring FW and a data line DL connected to the fan-out wiring FW.

The display driver 17 may be configured to supply a driving voltage ELVDD to the driving voltage supply line 11 and supply a common voltage ELVSS to the common voltage supply line 13. The driving voltage ELVDD may be applied to the pixel circuit of the pixels PX through a driving voltage line PL connected to the driving voltage supply line 11, and the common voltage ELVSS may be applied to an opposite electrode of a display element through the common voltage supply line 13.

The driving voltage supply line 11 may extend in the x-direction below the display area DA. The common voltage supply line 13 may have a loop shape having one open side to partially surround the display area DA, while being connected to different pads in the terminal part PAD.

Figure 3:
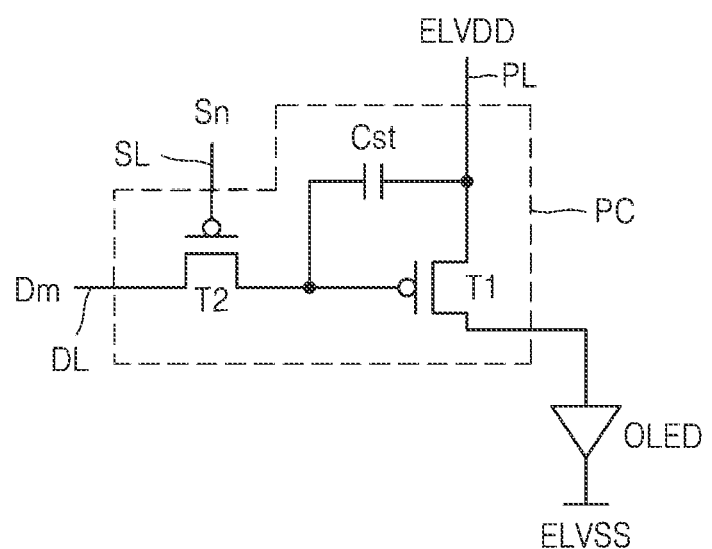
FIG. 3 is an equivalent circuit diagram of a pixel circuit driving a pixel according to some embodiments.

FIG. 3 is an equivalent circuit diagram of a pixel circuit PC driving a pixel according to some embodiments.

Referring to FIG. 3, the pixel circuit PC may be connected to an organic light-emitting diode OLED to implement light emission of pixels PX. The pixel circuit PC includes a driving thin-film transistor T1, a switching thin-film transistor T2, and a storage capacitor Cst. The switching thin-film transistor T2 may be connected to the scan line SL and the data line DL and configured to transfer a data signal Dm to the driving thin-film transistor T1 according to a scan signal Sn input through the scan line SL, the data signal Dm being input through the data line DL.

The storage capacitor Cst may be connected to the switching thin-film transistor T2 and the driving voltage line PL and may store a voltage corresponding to a difference between the driving voltage ELVDD and a voltage transferred from the switching thin-film transistor T2, the driving voltage ELVDD being supplied through the driving voltage line PL.

The driving thin-film transistor T1 may be connected to the driving voltage line PL and the storage capacitor Cst and configured to control a driving current flowing from the driving voltage line PL to the organic light-emitting diode OLED according to the voltage stored in the storage capacitor Cst. The organic light-emitting diode OLED may emit light having a preset brightness according to the driving current.

Though FIG. 3 describes the case where the pixel circuit PC includes two thin-film transistors and one storage capacitor, the embodiments according to the present disclosure are not limited thereto.

Figure 4:
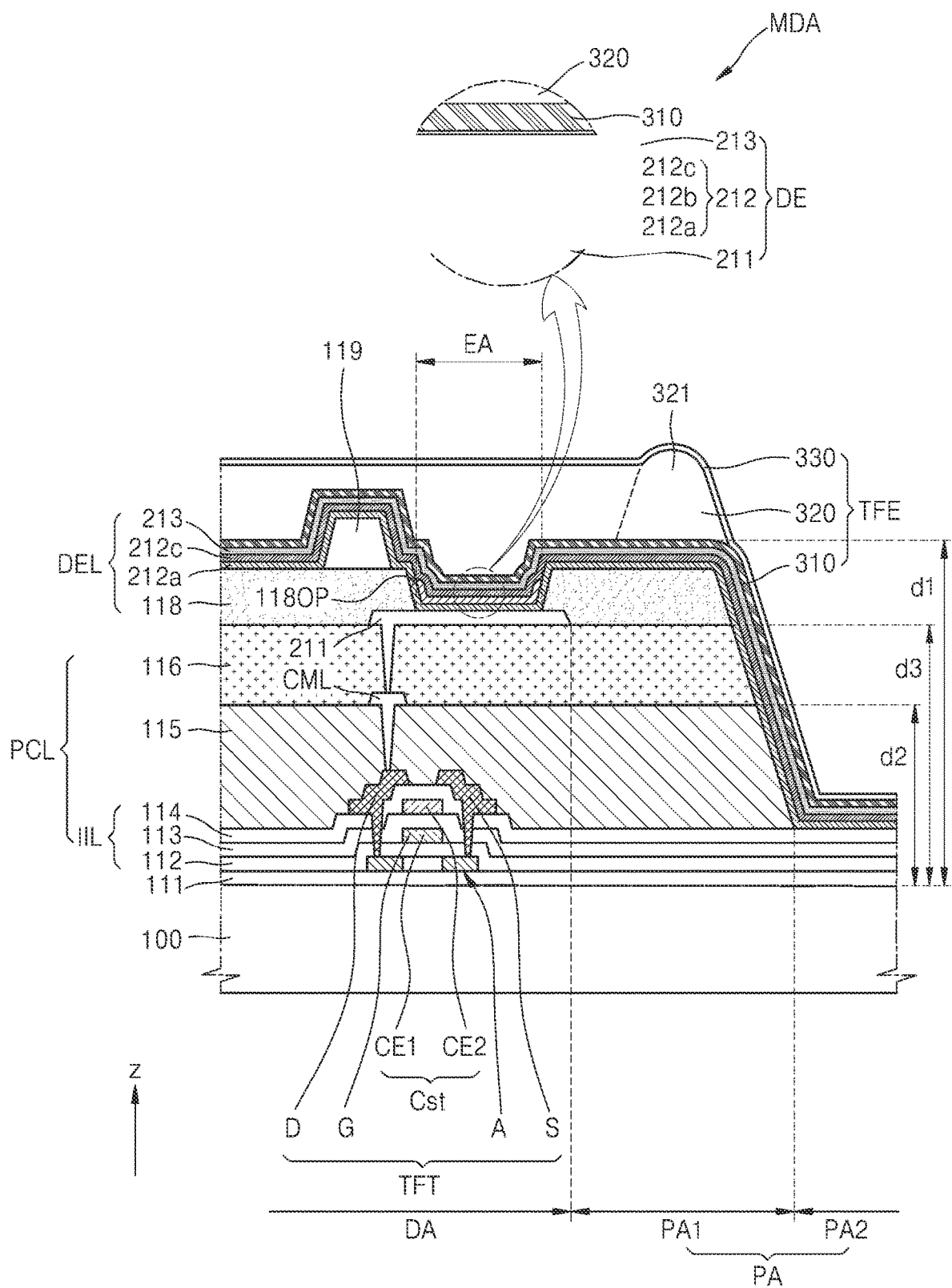
FIG. 4 is a cross-sectional view of a display panel according to some embodiments.

FIG. 4 is a cross-sectional view of the display panel 10 according to some embodiments. For example, FIG. 4 corresponds to a cross-sectional view of the display panel 10, taken along the line I-I' of FIG. 2. Hereinafter, a stack structure of the display panel 10 is briefly described.

Referring to FIG. 4, the display apparatus 1 may include the display substrate 100, a buffer layer 111, a pixel circuit layer PCL, a display element layer DEL, and a thin-film encapsulation layer TFE.

The display substrate 100 may include glass or a polymer resin such as polyethersulfone, polyarylate, polyetherimide, polyethylene naphthalate, polyethylene terephthalate, polyphenylene sulfide, polyimide, polycarbonate, cellulose tri acetate, and cellulose acetate propionate. The display substrate 100 including the polymer resin is flexible, rollable, and bendable. The display substrate 100 may have a multi-layered structure including a base layer and a barrier layer, the base layer including the polymer resin.

The buffer layer 111 may include an inorganic insulating material such as silicon nitride, silicon oxynitride, and silicon oxide and include a single layer or a multi-layer including the inorganic insulating material.

The pixel circuit layer PCL may be arranged on the buffer layer 111. The pixel circuit layer PCL may include a thin-film transistor TFT, an inorganic insulating layer IIL, a first planarization layer 115, and a second planarization layer 116, the thin-film transistor TFT being included in the pixel circuit PC, the inorganic insulating layer IIL, the first planarization layer 115, and the second planarization layer 116 being below and/or over elements of the thin-film transistor TFT. The inorganic insulating layer IIL may include a first gate insulating layer 112, a second gate insulating layer 113, and an interlayer insulating layer 114.

The thin-film transistor TFT may include a semiconductor layer A. The semiconductor layer A may include polycrystalline silicon. Alternatively, the semiconductor layer A may include amorphous silicon, an oxide semiconductor, or an organic semiconductor. The semiconductor layer A may include a channel region, a drain region, and a source region, the drain region and the source region being respectively on two opposite sides of the channel region. A gate electrode G may overlap the channel region.

The gate electrode G may include a low-resistance metal material. The gate electrode G may include a conductive material including molybdenum (Mo), aluminum (Al), copper (Cu), and titanium (Ti) and include a single layer or a multi-layer including the above materials.

The first gate insulating layer 112 between the semiconductor layer A and the gate electrode G may include an inorganic insulating material such as silicon nitride ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second gate insulating layer 113 may cover the gate electrode G. Similar to the first gate insulating layer 112, the second gate insulating layer 113 may include an inorganic insulating material such as silicon nitride ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

An upper electrode CE2 of the storage capacitor Cst may be arranged on the second gate insulating layer 113. The upper electrode CE2 may overlap the gate electrode G therebelow. In this case, the gate electrode G and the upper electrode CE2 overlapping each other with the second gate insulating layer 113 therebetween may constitute the storage capacitor Cst of the pixel circuit PC. That is, the gate electrode G may serve as a lower electrode CE1 of the storage capacitor Cst. Like this, the storage capacitor Cst may overlap the thin-film transistor TFT. According to some embodiments, the storage capacitor Cst may be arranged such that it does not overlap the thin-film transistor TFT (e.g., in a plan view).

The upper electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and include a single layer or a multi-layer including the above materials.

The interlayer insulating layer 114 may cover the upper electrode CE2. The interlayer insulating layer 114 may include silicon nitride ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 114 may include a single layer or a multi-layer including the above inorganic insulating materials.

The drain electrode D and the source electrode S may each be arranged on the interlayer insulating layer 114. The drain electrode D and the source electrode S may each include a material having excellent conductivity. The drain electrode D and the source electrode S may each include a conductive material including molybdenum (Mo), aluminum (Al), copper (Cu), and titanium (Ti) and include a single layer or a multi-layer including the above materials. According to some embodiments, the drain electrode D and the source electrode S may each have a multi-layered structure of Ti/Al/Ti.

The first planarization layer 115 may cover the drain electrode D and the source electrode S. The first planarization layer 115 may include an organic insulating material. The first planarization layer 115 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

A connection electrode CML may be arranged on the first planarization layer 115. In this case, the connection electrode CML may be connected to the drain electrode D or the source electrode S through a contact hole of the first planarization layer 115. The connection electrode CML may include a material having excellent conductivity. The connection electrode CML may include a conductive material including molybdenum (Mo), aluminum (Al), copper (Cu), and titanium (Ti) and include a single layer or a multi-layer including the above materials. According to some embodiments, the connection electrode CML may have a multi-layered structure of Ti/Al/Ti.

The second planarization layer 116 may cover the connection electrode CML. The second planarization layer 116 may include an organic insulating layer. The second planarization layer 116 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The display element layer DEL may be arranged on the pixel circuit layer PCL. The display element layer DEL may include a display element DE. The display element DE may be an organic light-emitting diode OLED. A pixel electrode 211 of the display element DE may be electrically connected to the connection electrode CML through a contact hole of the second planarization layer 116.

The pixel electrode 211 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. According to some embodiments, the pixel electrode 211 may further include a layer on/under the reflective layer, the layer including ITO, IZO, ZnO, or $In_2O_3$.

A pixel-defining layer 118 may be arranged on the pixel electrode 211, the pixel-defining layer 118 including an opening 118OP that exposes the central portion of the pixel electrode 211. The pixel-defining layer 118 may include an organic insulating material and/or an inorganic insulating material. The opening 118OP may define an emission area (referred to as an emission area EA, hereinafter) of light emitted from the display element DE. As an example, the width of the opening 118OP may correspond to the width of the emission area EA of the display element DE.

A spacer 119 may be arranged on the pixel-defining layer 118. The spacer 119 may be designed to prevent the destruction of the display substrate 100 in a method of manufacturing a display apparatus. A mask sheet may be used while a display panel is manufactured. The mask sheet may enter the inside of the opening 118OP of the pixel-defining layer 118 or be closely attached to the pixel-defining layer 118. In this case, the spacer 119 may prevent defects in which a portion of the display substrate 100 is damaged or destroyed by the mask sheet while deposition materials are deposited on the display substrate 100.

The spacer 119 may include an organic insulating material such as polyimide. Alternatively, the spacer 119 may include an inorganic insulating material including silicon nitride or silicon oxide, or include an organic insulating material and an inorganic insulating material.

According to some embodiments, the spacer 119 may include a material different from that of the pixel-defining layer 118. Alternatively, according to some embodiments, the spacer 119 may include the same material as that of the pixel-defining layer 118. In this case, the pixel-defining layer 118 and the spacer 119 may be simultaneously (or concurrently) formed during a mask process that uses a half-tone mask and the like.

An intermediate layer 212 may be arranged on the pixel-defining layer 118. The intermediate layer 212 may include an emission layer 212b arranged in the opening 118OP of the pixel-defining layer 118. The emission layer 212b may include a polymer organic material or a low-molecular weight organic material emitting light of a preset color.

A first functional layer 212a and a second functional layer 212c may be respectively arranged under and on the emission layer 212b. The first functional layer 212a may include, for example, a hole transport layer (HTL), or include an HTL and a hole injection layer (HIL). The second functional layer 212c is an element arranged on the emission layer 212b and may be provided optionally. The second functional layer 212c may include an electron transport layer (ETL) and/or an electron injection layer (EIL). Like an opposite electrode 213 described below, the first functional layer 212a and/or the second functional layer 212c may be common layers covering the display substrate 100 entirely.

The opposite electrode 213 may include a conductive material having a small work function. As an example, the opposite electrode 213 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the opposite electrode 213 may further include a layer on the (semi) transparent layer including the above materials, the layer including ITO, IZO, ZnO, or $In_2O_3$.

According to some embodiments, a capping layer may be further arranged on the opposite electrode 213. The capping layer may include lithium fluoride (LiF), an inorganic material, and/or an organic material.

The thin-film encapsulation layer TFE may be arranged on the opposite electrode 213. This is described below.

According to some embodiments, a touch electrode layer may be arranged on the thin-film encapsulation layer TFE. An optical functional layer may be arranged on the touch electrode layer. The touch electrode layer may be configured to obtain coordinate information corresponding to an external input, for example, a touch event. The optical functional layer may reduce reflectivity of light (external light) incident toward the display apparatus from the outside and/or improve color purity of light emitted from the display apparatus. According to some embodiments, the optical functional layer may include a retarder and/or a polarizer. The retarder may include a film-type retarder or a liquid crystal-type retarder. The retarder may include a λ/2 retarder and/or a λ/4 retarder. The polarizer may include a film-type polarizer or a liquid crystal-type polarizer. The film-type polarizer may include a stretchable synthetic resin film, and the liquid crystal-type polarizer may include liquid crystals arranged in an arrangement (e.g., a set or predetermined arrangement). Each of the retarder and the polarizer may further include a protective film.

According to some embodiments, the optical functional layer may include a black matrix and color filters. The color filters may be arranged by taking into account colors of pieces of light emitted respectively from the pixels of the display apparatus. The color filters may each include red, green, or blue pigment or dye. Alternatively, the color filters may each further include quantum dots in addition to the pigment or dye. Alternatively, some of the color filters may not include the pigment or dye and may include scattering particles such as titanium oxide.

According to some embodiments, the optical functional layer may include a destructive interference structure. The destructive interference structure may include a first reflection layer and a second reflection layer respectively arranged on different layers. First-reflected light and second-reflected light respectively reflected by the first reflection layer and the second reflection layer may destructively interfere and thus the reflectivity of external light may be reduced.

An adhesive member may be arranged between the touch electrode layer and the optical functional layer. For the adhesive member, a general one known in the art may be employed without limitation. The adhesive member may be a pressure sensitive adhesive (PSA).

The thin-film encapsulation layer TFE of the display panel 10 according to some embodiments is described with reference to FIG. 4. Referring to FIG. 4, the thin-film encapsulation layer TFE may be arranged on the opposite electrode 213. According to some embodiments, the thin-film encapsulation layer TFE may include at least one inorganic encapsulation layer and at least one organic encapsulation layer. It is shown in FIG. 4 that the thin-film encapsulation layer TFE includes a first inorganic encapsulation layer 310, an organic encapsulation layer 320, and a second inorganic encapsulation layer 330.

The first inorganic encapsulation layer 310 and the second inorganic encapsulation layer 330 may include at least one inorganic material from among aluminum oxide, titanium oxide, tantalum oxide, hafnium oxide, zinc oxide, silicon oxide, silicon nitride, and silicon oxynitride.

The first inorganic encapsulation layer 310 may cover the opposite electrode 213. The organic encapsulation layer 320 may be arranged on (e.g., a +z-direction of FIG. 4) the first inorganic encapsulation layer 310.

According to some embodiments, the organic encapsulation layer 320 may include a monomer material. Alternatively, the organic encapsulation layer 320 may include a polymer-based material. The polymer-based material may include an acryl-based resin, an epoxy-based resin, polyimide, and polyethylene. Alternatively, the organic encapsulation layer 320 may include acrylate.

According to some embodiments, the organic encapsulation layer 320 may include a protrusion 321. The protrusion 321 may include the same material as that of other portions of the organic encapsulation layer 320. As an example, in the case where the organic encapsulation layer 320 includes a monomer, the protrusion 321 may also include the same material including the monomer.

The protrusion 321 may protrude in a stack direction (e.g., a z-direction of FIG. 4, or when viewed in a plan view) at the end of the organic encapsulation layer 320, for example, the end adjacent to the peripheral area PA. In this case, the height (e.g., the length in the z-direction of FIG. 4) of the protrusion 321 may be 3 µm or more and less than 10 µm.

The protrusion 321 of the organic encapsulation layer 320 may form a dam in the periphery of the organic encapsulation layer 320, that is, the periphery of the organic encapsulation layer 320 viewed in a (−z)-direction of FIG. 4. The periphery of the organic encapsulation layer 320 may be adjacent to the display area DA as shown in FIG. 4. That is, the protrusion 321 forming the dam may be provided in a closed loop along the periphery of the display area DA. Accordingly, as described below, the organic encapsulation layer 320 may be prevented from flooding to the peripheral area PA without a separate dam during a process of manufacturing a display apparatus.

Here, as shown in FIG. 4, the display area DA is a region in which images are displayed and may be a region including the emission layer 212b, that is, the region to the outer end of the emission layer 212b. The peripheral area PA is a region outside the display area DA and may be a region not including the emission layer 212b.

According to some embodiments, the peripheral area PA may include a first peripheral area PA1 and a second peripheral area PA2, the first planarization layer 115 and/or the second planarization layer 116 being arranged in the first peripheral area PA1, and the second peripheral area PA2 being adjacent to the first peripheral area PA1. The second peripheral area PA2 may be a region in which the first planarization layer 115 and/or the second planarization layer 116 is not arranged. According to some embodiments, a third peripheral area may be further arranged outside the second peripheral area PA2, that is, on a side opposite the first peripheral area PA1, the first planarization layer 115 and/or the second planarization layer 116 being partially arranged in the third peripheral area. Hereinafter, the case where the peripheral area PA includes the first peripheral area PA1 and the second peripheral area PA2 is mainly described.

According to some embodiments, the protrusion 321 may be arranged on (e.g., the +z-direction of FIG. 4) the first planarization layer 115 and/or the second planarization layer 116. Alternatively, the protrusion 321 may be arranged over (e.g., the +z-direction of FIG. 4) the pixel-defining layer 118. In addition, according to some embodiments, the protrusion 321 may be arranged in the first peripheral area PA1.

Accordingly, when viewed in a direction perpendicular to one surface (e.g., a surface in the +z-direction of FIG. 4) of the display substrate 100, the protrusion 321 may overlap at least one of the first planarization layer 115, the second planarization layer 116, or the pixel-defining layer 118.

In this case, the protrusion 321 may be arranged in the end of the organic encapsulation layer 320, that is, the periphery of the organic encapsulation layer 320. That is, not only the protrusion 321 but all of the organic encapsulation layer 320 inside the protrusion 321 may be arranged on (e.g., the +z-direction of FIG. 4) the first planarization layer 115 and/or the second planarization layer 116. The organic encapsulation layer 320 may be arranged in the display area DA and the first peripheral area PA1 and may not be arranged in the second peripheral area PA2.

A minimum distance d1 between one surface (e.g., a surface in the +z-direction of FIG. 4) of the display substrate 100 and the organic encapsulation layer 320, for example, the protrusion 321, may be greater than a maximum distance d2 between one surface (e.g., a surface in the +z-direction of FIG. 4) of the display substrate 100 and the first planarization layer 115. As an example, in FIG. 4, the distance d1 between one surface (e.g., a surface in the +z-direction of FIG. 4) of the display substrate 100 and the organic encapsulation layer 320, for example, the lower surface (e.g., a surface in a (−) z-direction of FIG. 4) of the protrusion 321, may be greater than the distance d2 between one surface (e.g., a surface in the +z-direction of FIG. 4) of the display substrate 100 and the upper surface (e.g., a surface in the +z-direction of FIG. 4) of the first planarization layer 115.

Similar to this, the minimum distance d1 between one surface (e.g., a surface in the +z-direction of FIG. 4) of the display substrate 100 and the organic encapsulation layer 320, for example, the protrusion 321, may be greater than a maximum distance d3 between one surface (e.g., a surface in the +z-direction of FIG. 4) of the display substrate 100 and the second planarization layer 116. As an example, in FIG. 4, the distance d1 from one surface (e.g., a surface in the +z-direction of FIG. 4) of the display substrate 100 to the organic encapsulation layer 320, for example, the lower surface (e.g., a surface in the (−) z-direction of FIG. 4) of the protrusion 321 may be greater than the distance d3 from one surface (e.g., a surface in the +z-direction of FIG. 4) of the display substrate 100 to the upper surface (e.g., a surface in the +z-direction of FIG. 4) of the second planarization layer 116.

Because the organic encapsulation layer 320 includes the protrusion 321, the organic encapsulation layer 320 may be arranged in a region in which the first planarization layer 115 and/or the second planarization layer 116 is arranged, that is, in the display area DA and the first peripheral area PA1 according to some embodiments. For example, when viewed in a direction perpendicular to one surface (e.g., a surface in the +z-direction of FIG. 4) of the display substrate 100, the organic encapsulation layer 320 may be arranged in a region in which the first planarization layer 115 and/or the second planarization layer 116 is arranged. Alternatively, when viewed in a direction perpendicular to one surface of the display substrate 100, the organic encapsulation layer 320 may be arranged inside a region in which the pixel-defining layer 118 is arranged.

The organic encapsulation layer 320 may be also arranged in the display area DA and a portion of the peripheral area PA adjacent to the display area DA, that is, the first peripheral area PA1. As shown in FIG. 4, the first planarization layer 115 and the second planarization layer 116 covering the thin-film transistor TFT may be arranged in the display area DA, may have a gradually reducing thickness (a length in the z-direction of FIG. 14) toward the peripheral area PA, and may not be arranged from one point of the peripheral area PA. The organic encapsulation layer 320 may be arranged in a region in which the first planarization layer 115 and/or the second planarization layer 116 is arranged. That is, the organic encapsulation layer 320 may be arranged from the display area DA to one point of the peripheral area PA at which the planarization layer is not arranged, and may not be arranged in the peripheral area PA in which the planarization layer is not arranged.

As described above, because the organic encapsulation layer 320 does not flood over the upper portion of the planarization layer including the first and second planarization layers 115 and 116, that is, does not flood from the first peripheral area PA1 to the second peripheral area PA2, the display apparatus 1 does not need a separate dam in the second peripheral area PA2. Accordingly, a space in which a dam is arranged does not need to be secured in the second peripheral area PA2, and thus, a dead space may be reduced.

Figure 5:
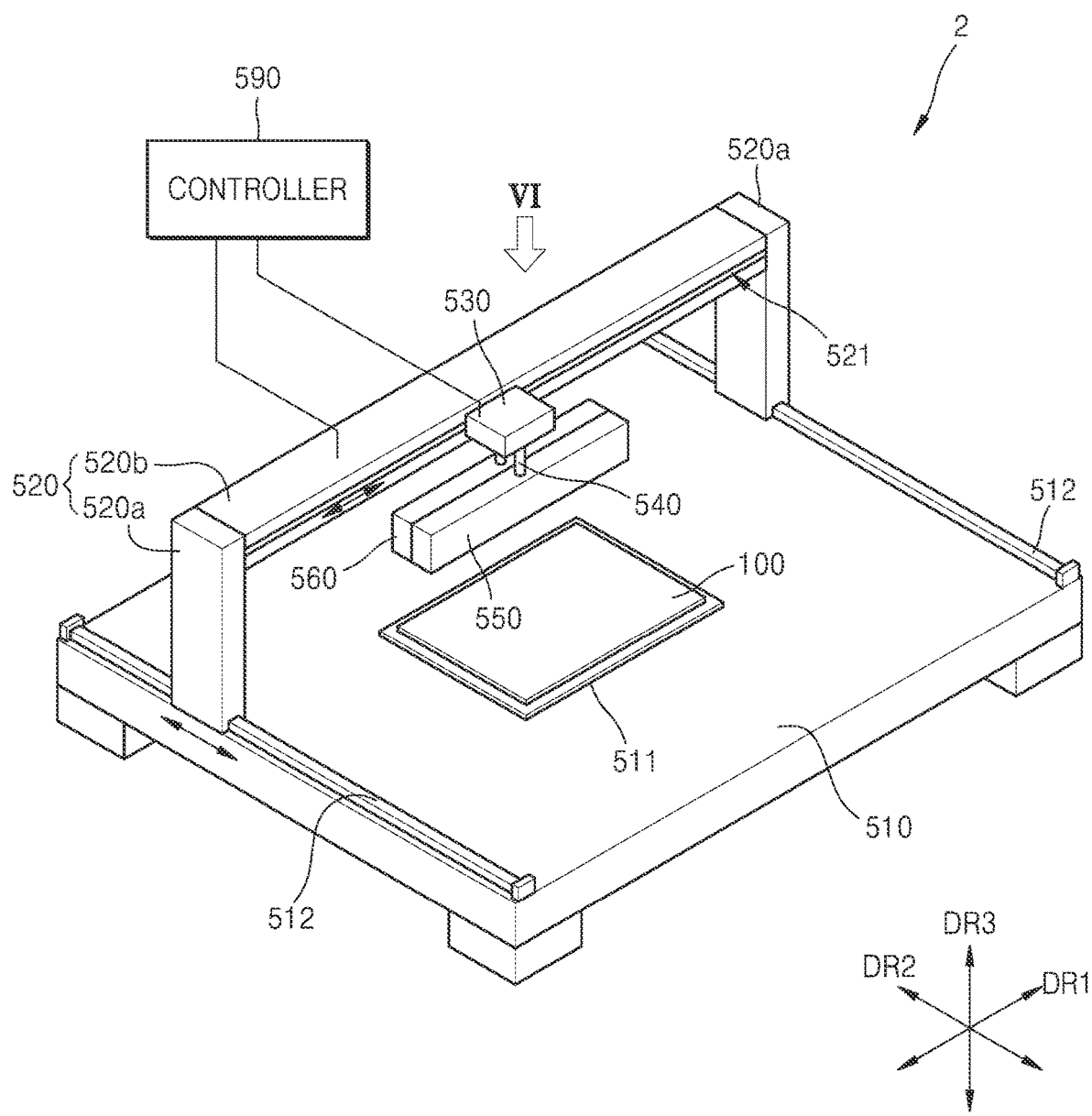
FIG. 5 is a perspective view of an apparatus of manufacturing a display apparatus according to some embodiments.

FIG. 5 is a perspective view of an apparatus 2 of manufacturing a display apparatus according to some embodiments. Though the apparatus 2 for manufacturing a display apparatus may be an apparatus for manufacturing the display apparatus 1, it is not limited thereto.

The apparatus 2 for manufacturing a display apparatus may include a supporter 510, a first moving part 520, a second moving part 530, a third moving part 540, a discharge part 550, a hardening part 560, and a controller 590. According to some embodiments, the apparatus 2 for manufacturing a display apparatus may include an apparatus configured to stack an organic encapsulation layer to the display apparatus 1.

According to some embodiments, the first moving part 520, the second moving part 530, the third moving part 540, the discharge part 550, and the hardening part 560 may be arranged on the supporter 510. The supporter 510 may have a plane defined by a first direction DR1 and a second direction DR2 crossing the first direction DR1.

According to some embodiments, a stage 511 and guide parts 512 may be further provided on the supporter 510. The stage 511 may be arranged on the supporter 510 and may have a plane defined by the first direction DR1 and the second direction DR2 crossing the first direction DR1. A display substrate 100 may be seated on the stage 511. A plurality of layers, for example, layers including an inorganic encapsulation layer, may be seated on the display substrate 100. The discharge part 550 may be attached to the display substrate 100 to form some of layers of the display apparatus, for example, the organic encapsulation layer. The stage 511 may form a working region of an inkjet printing process.

The guide parts 512 may be arranged on the supporter 510 and apart from each other with the stage 511 therebetween. As an example, two guide parts 512 may be provided and apart from each other in the first direction DR1. The guide parts 512 may each extend in the second direction DR2. An extension length of each guide part 512 in the second direction DR2 may be greater than at least the length of the edge of the display substrate 100 in the second direction DR2.

The guide parts 512 may guide the first moving part 520 such that the first moving part 520 linearly moves in the extension direction of the guide parts 512. The guide parts 512 may include, for example, a linear motion rail.

As an example, the first moving part 520 may reciprocate linearly in the second direction DR2. The first moving part 520 may include pillar members 520a and a horizontal member 520b. Though it is shown in FIG. 5 that the pillar members 520a and the horizontal member 520b each have a rectangular rod shape, the shapes of the pillar members 520a and the horizontal member 520b are not limited thereto.

The pillar members 520a of the first moving part 520 may extend in a third direction DR3 crossing the first direction DR1 and the second direction DR2. As an example, two pillar members 520a may be provided and arranged on two opposite sides with the stage 511 therebetween. The pillar members 520a may each move in the extension direction of the guide parts 512, that is, in the second direction DR2. According to some embodiments, the pillar members 520a may be configured to perform a linear motion manually or perform a linear motion automatically by including a motor cylinder and the like. As an example, the pillar members 520a may be configured to perform a linear motion by including a linear motion block that moves along a linear motion rail.

The horizontal member 520b of the first moving part 520 may extend in the first direction DR1 between the pillar members 520a. The ends on two opposite sides of the horizontal member 520b may be respectively connected to upper portions of the pillar members 520a. The horizontal member 520b may include a first groove portion 521 extending in the extension direction of the horizontal member 520b, that is, the first direction DR1. The first groove portion 521 may be arranged in one lateral surface of the horizontal member 520b. As an example, the first groove portion 521 may be arranged in one of the lateral surfaces of the first moving part 520 that faces the second direction DR2. The first groove portion 521 may guide the second moving part 530 such that the second moving part 530 reciprocates linearly in the extension direction of the first groove portion 521.

According to some embodiments, the second moving part 530 may linearly move in the first direction DR1. The second moving part 530 may be movably connected to one lateral surface of the horizontal member 520b of the first moving part 520. As an example, the second moving part 530 may be arranged on the lateral surface in which the first groove portion 521 of the first moving part 520 is arranged. The second moving part 530 may move reciprocate linearly in the first direction DR1 along the first groove portion 521. According to some embodiments, the second moving part 530 may include a linear motor and the like.

According to some embodiments, the third moving part 540 may be arranged on side of the second moving part 530 and may reciprocate linearly in the third direction DR3. As an example, the third moving part 540 may be arranged on the lower surface of the second moving part 530. Here, the lower surface of the second moving part 530 may be a surface through which second moving part 530 faces the stage 511. According to some embodiments, the third moving part 540 may include a pneumatic cylinder. In addition, the third moving part 540 may rotate around an axis line extending in the third direction DR3. For this purpose, the third moving part 540 may include, for example, an electric motor, a pneumatic motor, and the like.

According to some embodiments, the discharge part 550 may be arranged on the lower surface (the third direction DR3 of FIG. 5) of the third moving part 540. The discharge part 55 may move together as the first moving part 520, the second moving part 530, and the third moving part 540 move. That is, the first to third moving parts 520, 530, and 540 may move the discharge part 550 in the first to third directions DR1, DR2, and DR3. As an example, a moving range of the discharge part 550 may be substantially the same as a region of the supporter 510. The discharge part 550 may be rotated around an axis line extending in the third direction DR3 by the third moving part 540.

The construction of the discharge part 550 described above is not limited thereto. As an example, the discharge part 550 may be fixed and the stage 511 may be moved. However, for convenience of description, the case where the discharge part 550 is transferred as described above is mainly described.

Referring to FIG. 5 again, the discharge part 550 may be configured to discharge droplets in the third direction DR3 toward the display substrate 100. In this case, according to some embodiments, droplets may include a polymer organic material or a low-molecular weight organic material for forming the organic encapsulation layer, for example, a material including monomer.

The hardening part 560 may be arranged on one side of the discharge part 550, for example, a side opposite the direction in which the discharge part 550 moves to discharge droplets. According to some embodiments, the hardening part 560 may be adjacent to the discharge part 550. According to some embodiments, the hardening part 560 may be apart from the discharge part 550 and connected to the discharge part 550 by a connection member. Alternatively, the discharge part 550 and the hardening part 560 may be received together in a housing.

The hardening part 560 may move together as the discharge part 550 moves. Accordingly, as the first moving part 520, the second moving part 530, and the third moving part 540 move, the hardening part 560 may move together therewith. That is, the first to third moving parts 520, 530, and 540 may move the hardening part 560 in the first to third directions DR1, DR2, and DR3. In addition, the hardening part 560 may rotate together when the discharge part 550 rotates.

The hardening part 560 may harden droplets discharged by the discharge part 550. According to some embodiments, the hardening part 560 may harden a polymer organic material or a low-molecular weight organic material for forming the organic encapsulation layer, for example, a material including a monomer.

The controller 590 may be electrically connected to the first moving part 520, the second moving part 530, and the third moving part 540 and configured to control the positions and movements of the first to third moving parts 520, 530, and 540. The controller 590 may be electrically connected to the discharge part 550 and configured to control a droplet-discharging time, a droplet-discharging amount, a droplet-discharging position, and the like. In addition, the controller 590 may be electrically connected to the hardening part 560 and configured to control a hardening time of the hardening part 560, a light-irradiating amount for hardening, a light-irradiating position for hardening, and the like.

Figure 6:
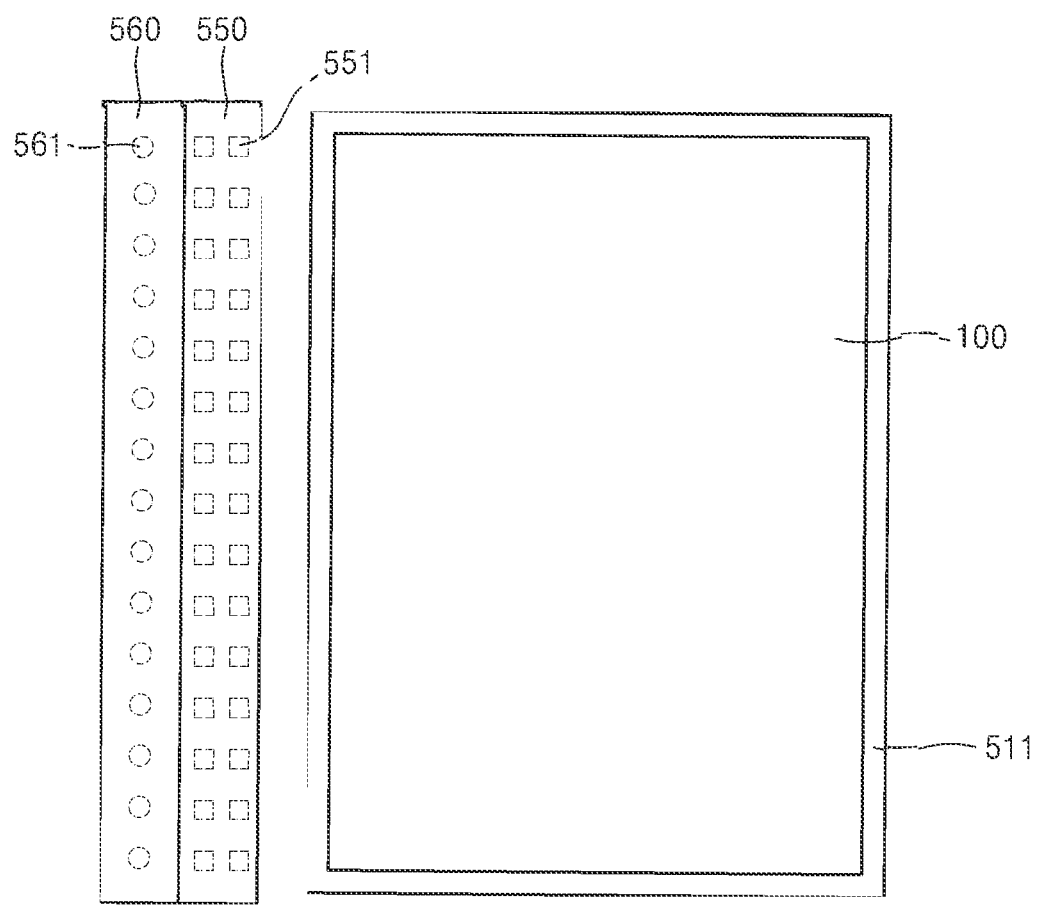
FIG. 6 is a plan view of the apparatus of manufacturing a display apparatus when viewed in a direction VI of FIG. 5.
Figure 7:
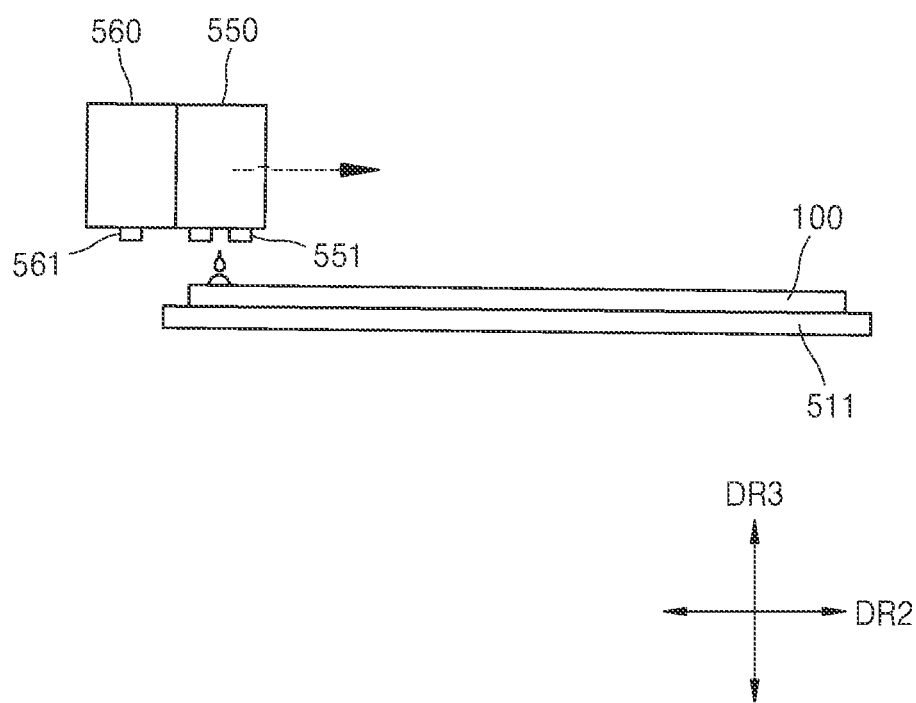
FIGS. 7 and 8 are views of the apparatus of manufacturing a display apparatus when viewed in a direction VII of FIG. 6.
Figure 8:
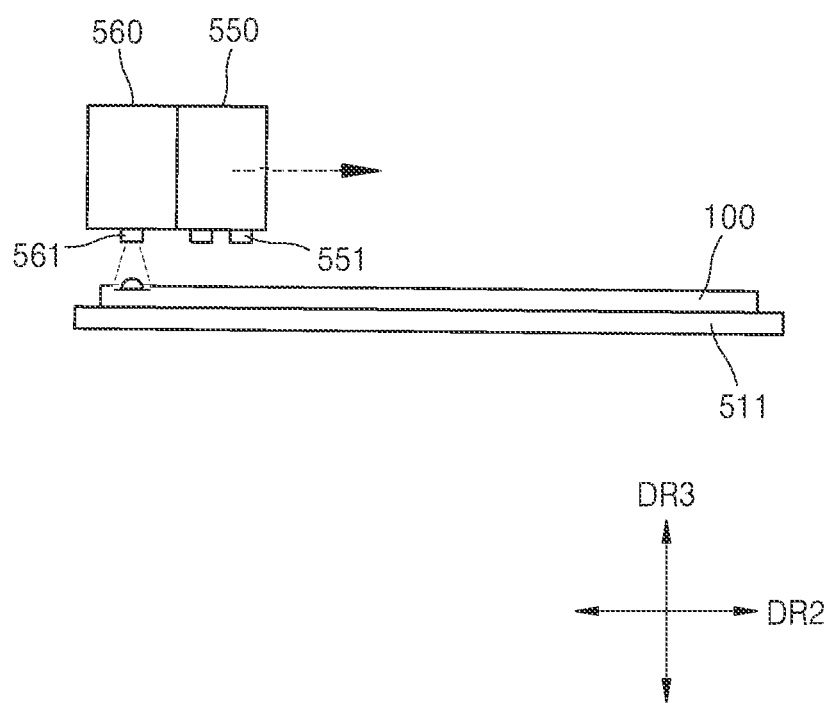

FIG. 6 is a plan view of the apparatus of manufacturing a display apparatus when viewed in a direction VI of FIG. 5, and FIGS. 7 and 8 are views of the apparatus of manufacturing a display apparatus when viewed in a direction VII of FIG. 6. Specifically, for understanding, FIGS. 6 to 8 mainly show the discharge part 550, the hardening part 560, and the display substrate 100. In addition, FIGS. 6 to 8 show the case where one display substrate 100 is provided as an example.

Referring to FIG. 6, the discharge part 550 may include a nozzle 551 and discharge droplets through the nozzle 551. The nozzle 551 may be arranged on one surface of the discharge part 550, for example, a surface of the discharge part 550 that faces the display substrate 100.

The discharge part 550 may include a plurality of nozzles 551. The plurality of nozzles 551 may be apart from each other such that the nozzles 551 are aligned in a plurality of columns and a plurality of rows in the discharge part 550. Though it is shown in FIG. 6 that the plurality of nozzles 551 are arranged in fifteen rows and two columns, the embodiments according to the present disclosure are not limited thereto. In addition, though it is shown that the cross-section of the discharge part 550 is rectangular, the embodiments according to the present disclosure are not limited thereto.

The discharge part 550 may move in the second direction (the second direction DR2 of FIG. 6) in the upper portion (the third direction DR3 of FIG. 6) of the display substrate 100 to discharge droplets to the display substrate 100. It is shown in FIG. 6 that the length of a side of the discharge part 550 in the first direction DR1 is greater than the length of a side of the display substrate 100 in the first direction DR1. In this case, it may be sufficient that the discharge part 550 moves in the second direction DR2 to coat droplets to all of one side of the display substrate 100. According to some embodiments, the length of a side of the discharge part 550 in the first direction DR1 may be less than the length of a side of the display substrate 100 in the first direction DR1. In this case, the discharge part 550 may move in the second direction DR2 and the first direction DR1 crossing the second direction DR2 to coat droplets to one side of the display substrate 100. Hereinafter, for convenience of description, the case where the discharge part 550 moves in the second direction DR2 is mainly described.

The hardening part 560 may include a light-emitting member 561 and harden droplets by irradiating light through the light-emitting member 561. According to some embodiments, the light-emitting member 561 may include a light-emitting diode module. According to some embodiments, the light-emitting member 561 may irradiate an ultraviolet ray, and thus, the hardening part 560 may harden the droplets through the ultraviolet ray. According to some embodiments, the light-emitting member 561 may irradiate an infrared ray, and thus, the hardening part 560 may harden the droplets through the infrared ray. In addition, the wavelength of light irradiated by the light-emitting member 561 may be selected depending on the kind of droplets or the kind of a photoinitiator. Hereinafter, for convenience of description, the case where the light-emitting member 561 hardens droplets by irradiating an ultraviolet ray is mainly described.

The hardening part 560 may include a plurality of light-emitting members 561. The plurality of light-emitting members 561 may be apart from each other in a plurality of columns and a plurality of rows in the hardening part 560. Though it is shown in FIG. 6 that the plurality of nozzles 551 are arranged in fifteen rows and one column, the embodiments according to the present disclosure are not limited thereto. In addition, though it is shown that the cross-section of the hardening part 560 is rectangular, the embodiments according to the present disclosure are not limited thereto.

The hardening part 560 may be adjacent to the discharge part 550 and may move in the same direction as the moving direction of the discharge part 550. In addition, the hardening part 560 may be arranged on the rear end of the discharge part 550 in the moving direction. Accordingly, the discharge part 550 may discharge droplets and then immediately harden the droplets by using the hardening part 560.

Figure 9:
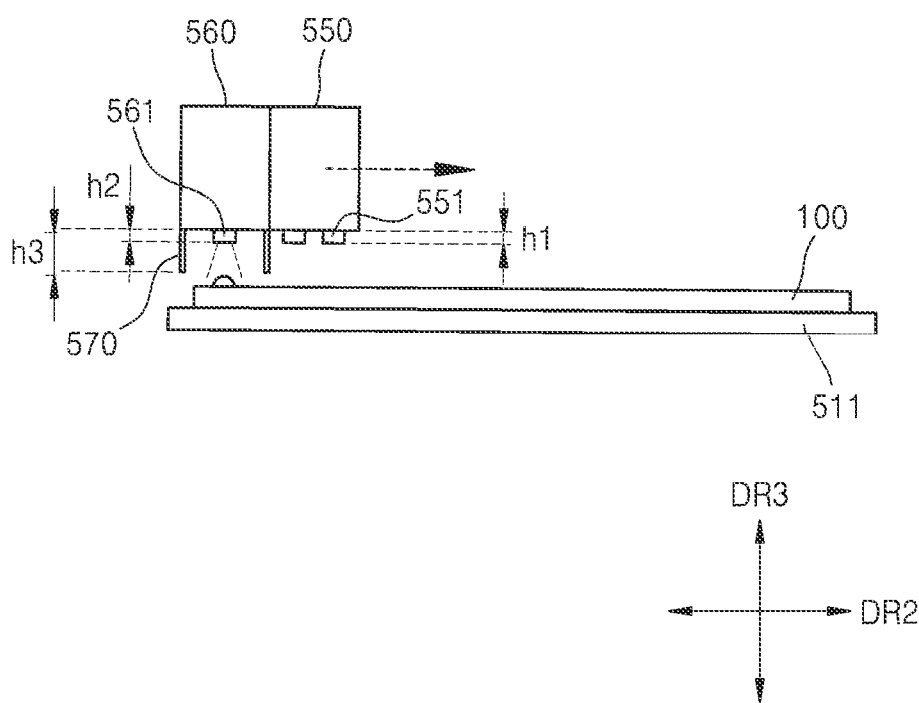
FIG. 9 is a view of an apparatus of manufacturing a display apparatus according to some embodiments.

FIG. 9 is a view of the apparatus 2 of manufacturing a display apparatus according to some embodiments.

Referring to FIG. 9, the apparatus 2 of manufacturing a display apparatus may further include a blocking part 570. The blocking part 570 may be arranged on the hardening part 560, for example, around the light-emitting member 561, and may guide a path of light irradiated by the light-emitting member 561. According to some embodiments, the blocking part 570 may be arranged between the hardening part 560 and the discharge part 550. In this case, the blocking part 570 may extend in the third direction DR3. A length h3 of the blocking part 570 in the third direction DR3 may be greater than lengths h2 and h1 of the light-emitting member 561 and/or the nozzle 551 in the third direction DR3. Accordingly, light irradiated by the light-emitting member 561, for example, an ultraviolet ray, may be blocked by the blocking part 570 and not irradiated to the surroundings. Light irradiated by the light-emitting member 561 may be configured to selectively harden only droplets desired to be hardened. In addition, light may be prevented from being irradiated to a region of the display substrate 100 on which droplets are not discharged.

FIGS. 10 to 13 are views showing a method of manufacturing a display apparatus according to some embodiments.

The method of manufacturing a display apparatus according to some embodiments may be a method of manufacturing the display apparatus 1 or a method using the apparatus 2 for manufacturing a display apparatus. However, the method is not limited thereto.

First, referring to FIG. 9 again, the display substrate 100 may be arranged on the stage 511. As described above, the pixel circuit layer, the display element layer, and the first inorganic encapsulation layer may be stacked on the display substrate 100.

Figure 10:
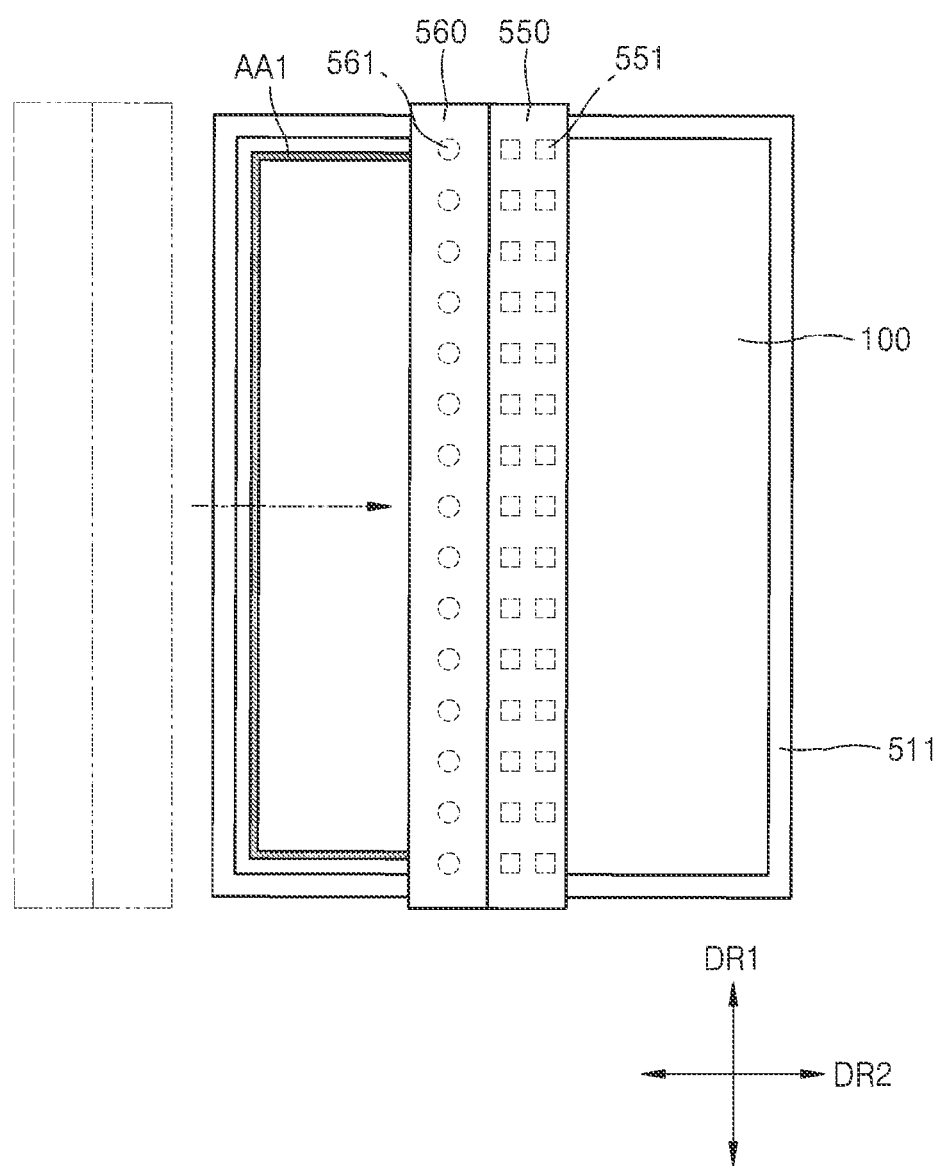
FIGS. 10 to 13 are views showing a method of manufacturing a display apparatus according to some embodiments.

Referring to FIG. 10, the discharge part 550 may move along the display substrate 100 and discharge droplets while being apart in the third direction DR3 from the display substrate 100. According to some embodiments, as described above, the discharge part 550 may discharge droplets to a first region AA1 adjacent to the periphery of the display area DA. The first region AA1 may be a region arranged on at least one of the first planarization layer 115, the second planarization layer 116, or the pixel-defining layer 118 to overlap the at least one of the first planarization layer 115, the second planarization layer 116, or the pixel-defining layer 118 in the third direction DR3.

To discharge droplets to only the first region AA1, only the nozzles 551 over the first region AA1 may operate and nozzles 551 over the other regions may not operate. According to some embodiments, the controller 590 may store image information of the first region AA1, and control the nozzles 551 such that the discharge part 550 discharges droplets accordingly.

According to some embodiments, droplets may include a polymer organic material or a low-molecular weight organic material for forming the organic encapsulation layer, for example, a material including a monomer.

The discharge part 550 discharges droplets to the first region AA1, and then, the droplets may be immediately hardened by the hardening part 560 adjacent to the discharge part 550. Specifically, as the discharge part 550 moves in the third direction DR3, the hardening part 560 may also move in the third direction DR3. In addition, immediately after the discharge part 550 discharges droplets at the rear end of the discharge part 550 in the moving direction, the hardening part 560 may irradiate light to harden the droplets. This may allow the droplets to harden without running down. According to some embodiments, the hardening part 560 may harden the droplets by irradiating an ultraviolet ray or an infrared ray. Hereinafter, the case where the droplets are hardened by irradiating an ultraviolet ray is mainly described.

To irradiate an ultraviolet ray to only droplets discharged in the first region AA1, only the light-emitting member 561 over the first region AA1 may operate and the light-emitting member 561 over the other regions may not operate. According to some embodiments, the controller 590 may control an operation of the light-emitting member 561 by using image information of the first region AA1 that is stored.

Figure 11:
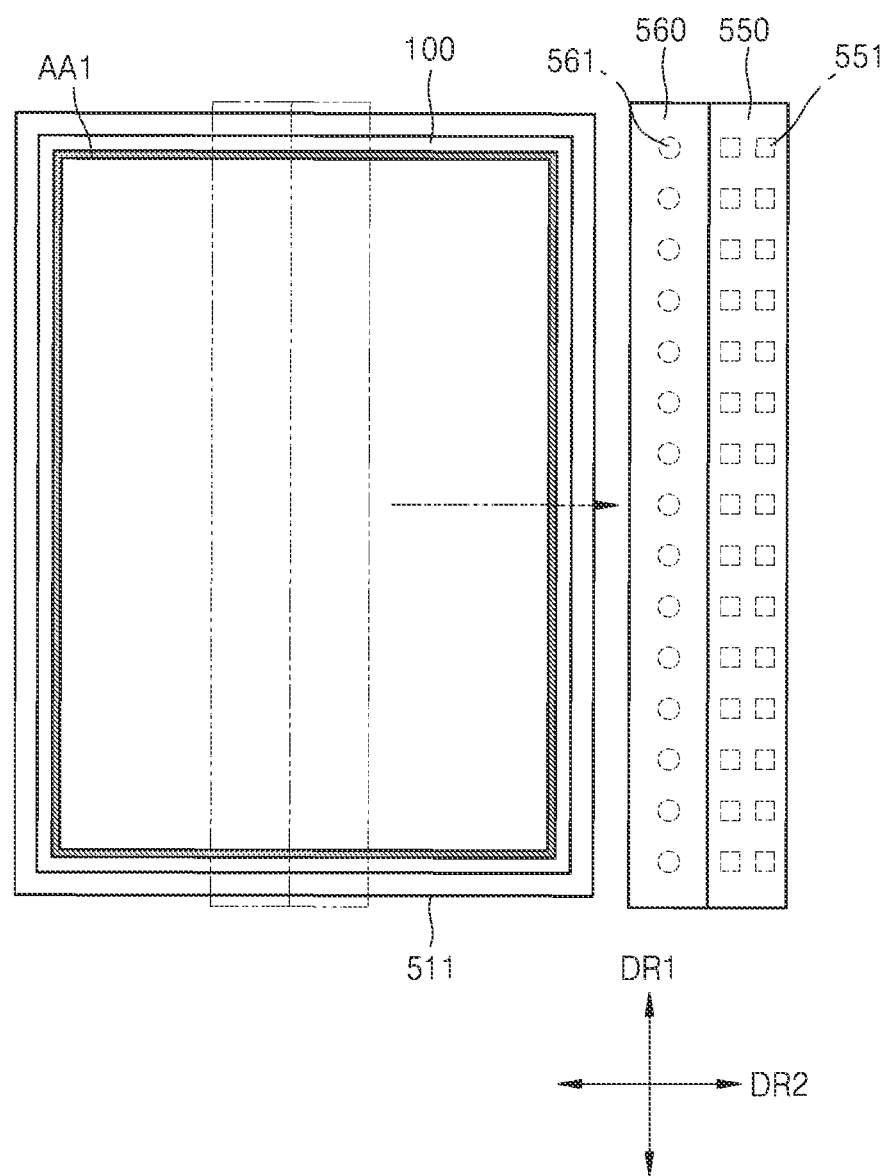

Referring to FIG. 11, as the discharge part 550 and the hardening part 560 pass across the display substrate 100 completely, droplets may form a dam over the display substrate 100, specifically, on the first inorganic encapsulation layer 310. The dam may be formed in a closed loop along the periphery of the display area DA.

Figure 12:
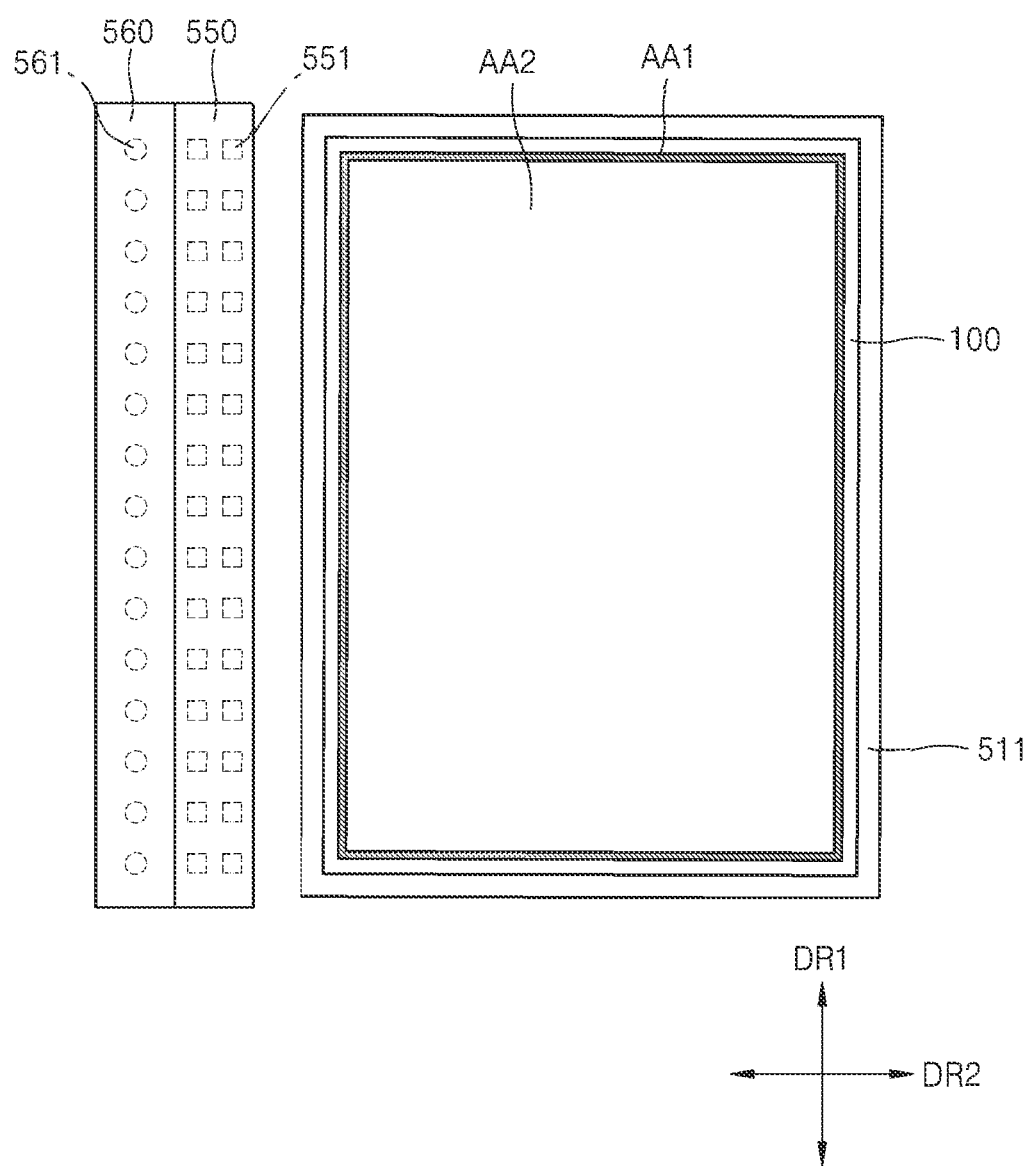

Referring to FIG. 12, to discharge droplets in a second region AA2, the discharge part 550 and the hardening part 560 may move to a start position again, that is, the position shown in FIG. 12. However, the embodiments according to the present disclosure are not limited thereto, and the discharge part 550 and the hardening part 560 may start to discharge droplets in the second region AA2 at a position where droplet-discharging in the first region AA1 has been completed. Hereinafter, the case where the discharge part 550 and the hardening part 560 return to the start position again and start droplet-discharging is mainly described.

Figure 13:
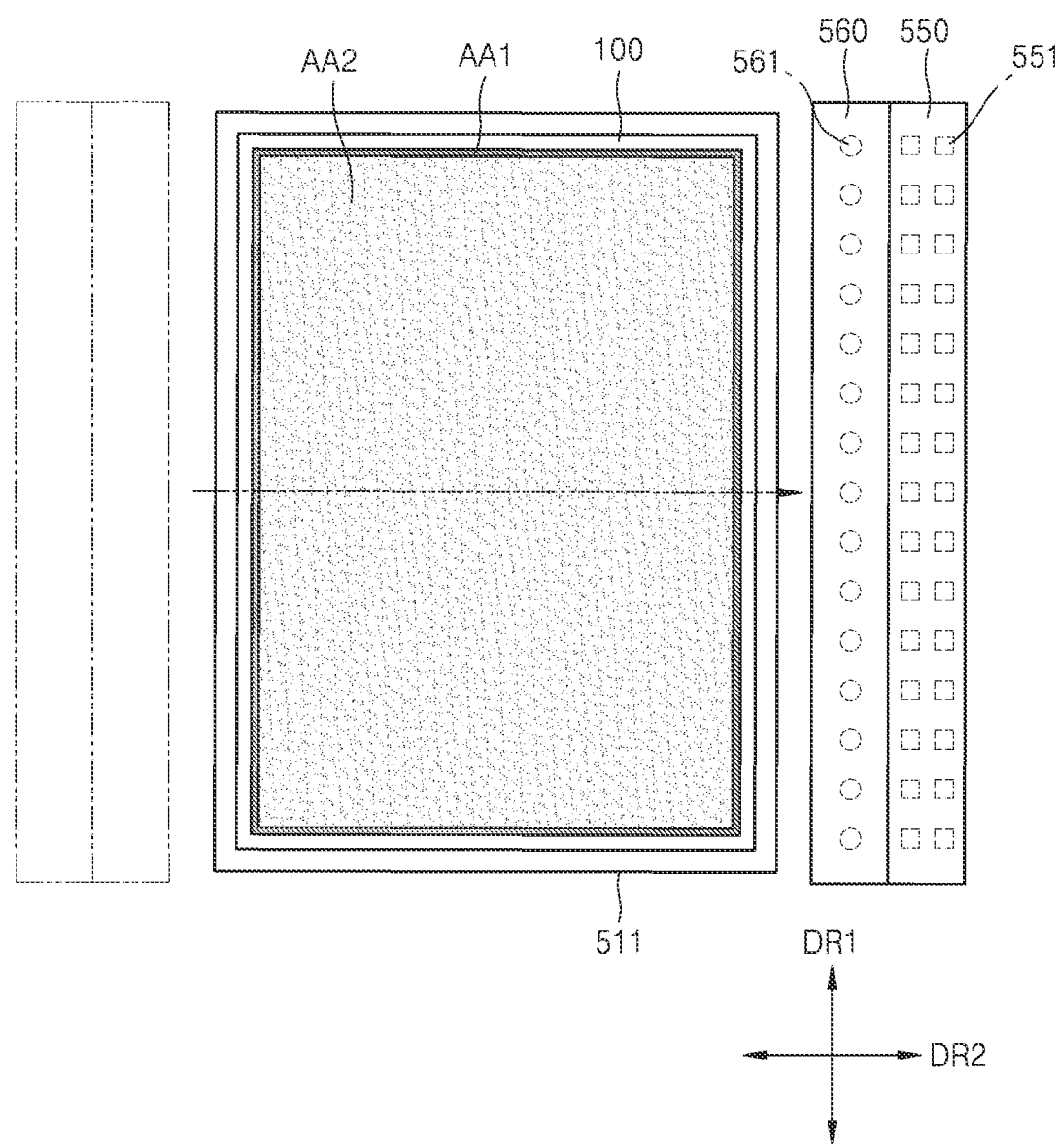

Referring to FIG. 13, the discharge part 550 may move along the display substrate 100 and discharge droplets in the second region AA2 while being apart in the third direction DR3 from the display substrate 100. The second region AA2 may be surrounded by the first region AA1.

Similar to that described above, to discharge droplets in only the second region AA2, only the nozzles 551 over the second region AA2 may operate and the nozzles 551 over the other regions may not operate.

According to some embodiments, droplets discharged in the second region AA2 may include the same material as that of droplets discharged in the first region AA1.

The discharge part 550 discharges droplets in the second region AA2, and then, the droplets may be immediately hardened by the hardening part 560 adjacent to the discharge part 550. In this case, similar to that described above, to irradiate an ultraviolet ray to only droplets discharged in the second region AA2, only the light-emitting member 561 over the second region AA2 may operate and the light-emitting member 561 over the other regions may not operate.

As described above, because the dam including an organic material is formed in the first region AA1 and droplets including an organic material are discharged in the second region AA2 surrounded by the first region AA1, the dam may be formed by itself while the organic encapsulation layer is formed. Accordingly, a separate dam configured to prevent reflow of droplets may not be formed over the display substrate 100, and a dead space in the peripheral area PA may be reduced.

Figure 14:
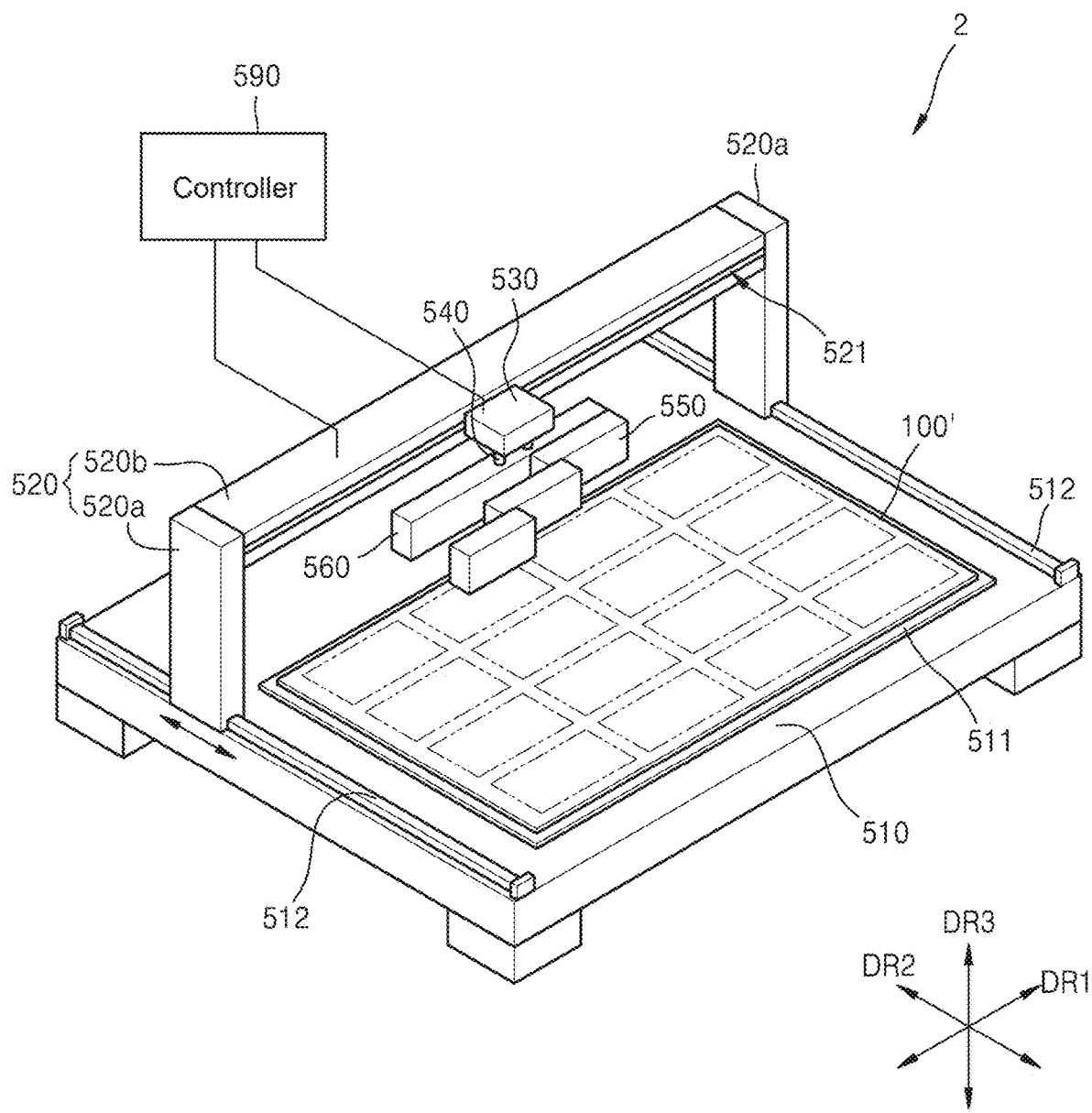
FIG. 14 is a perspective view of an apparatus of manufacturing a display apparatus according to some embodiments.
Figure 15:
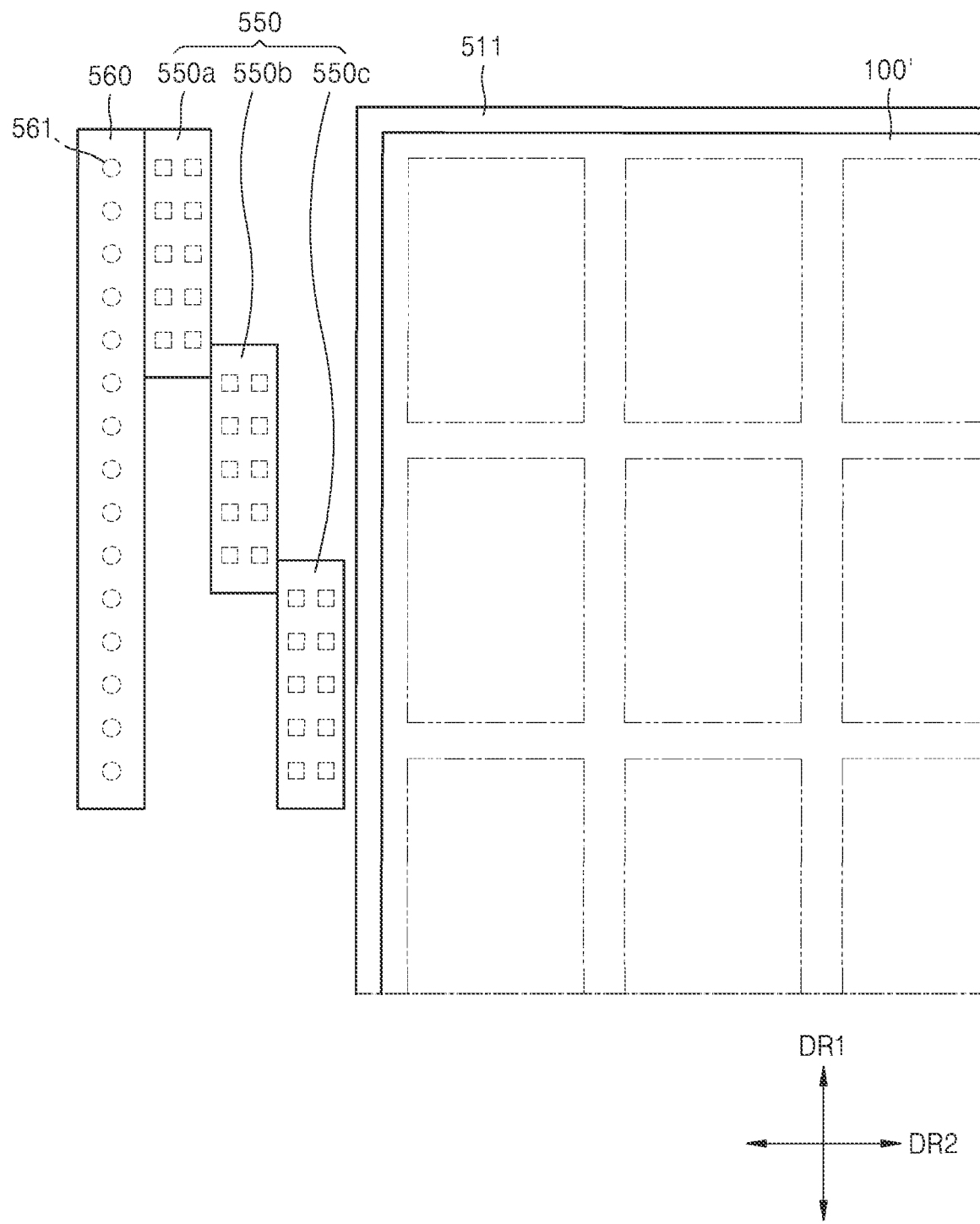
FIG. 15 is a plan view of an apparatus of manufacturing a display apparatus according to some embodiments.

FIG. 14 is a perspective view of the apparatus 2 of manufacturing a display apparatus according to some embodiments, and FIG. 15 is a plan view of the apparatus 2 of manufacturing a display apparatus according to some embodiments. Because the present embodiments are similar to the above embodiments, differences are mainly described below.

Referring to FIGS. 14 and 15, the apparatus 2 of manufacturing a display apparatus may include a plurality of discharge parts 550 and/or a plurality of hardening parts 560. A mother substrate 100' that may be cut into a plurality of display substrates 100 afterwards may be arranged on the apparatus 2 of manufacturing a display apparatus.

The plurality of discharge parts 550 may include, for example, a first discharge part 550a, a second discharge part 550b, and a third discharge part 550c. However, the embodiments according to the present disclosure are not limited thereto, and the number of discharge parts 550 may be three or more.

According to some embodiments, the first to third discharge parts 550a, 550b, and 550c may be received in a housing. In addition, as described above, the first to third discharge parts 550a, 550b, and 550c may be connected to the hardening part 560 and may move together with the hardening part 560.

According to some embodiments, the length of a side of each of the first to third discharge parts 550a, 550b, and 550c in the first direction DR1 may be less than the length of a side of the display substrate 100 in the first direction.

In this case, the first to third discharge parts 550a, 550b, and 550c may be apart from each other in the second direction DR2 and portions of the first to third discharge parts 550a, 550b, and 550c in the first direction DR1 may overlap each other. Accordingly, when the plurality of discharge parts 550 discharge droplets to the display substrate 100, the discharge parts 550 may discharge droplets while covering the display substrate 100 entirely.

According to some embodiments, the hardening part 560 may be arranged on the rear end of the first to third discharge parts 550a, 550b, and 550c in the moving direction. The length of the hardening part 560 in the first direction DR1 may be determined to cover all of the lengths of the first to third discharge parts 550a, 550b, and 550c in the first direction DR1.

Figure 16:
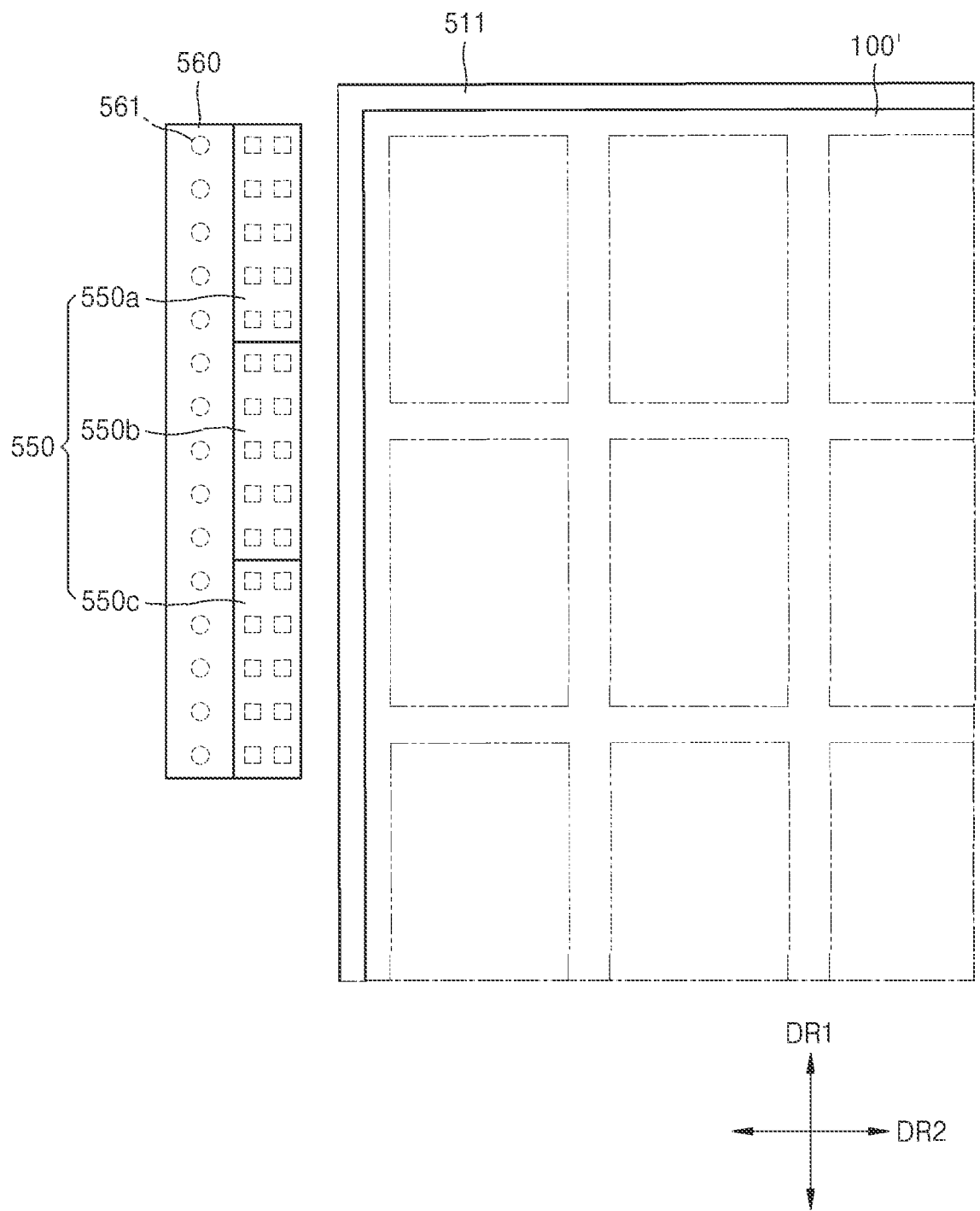
FIG. 16 is a plan view of an apparatus of manufacturing a display apparatus according to some embodiments.

FIG. 16 is a plan view of an apparatus of manufacturing a display apparatus according to some embodiments.

Referring to FIG. 16, according to some embodiments, the first to third discharge parts 550a, 550b, and 550c may be arranged in a line. In this case, the length of each of the first to third discharge parts 550a, 550b, and 550c in the first direction DR1 may be greater than the length of the display substrate 100 in the first direction DR1.

Figure 17:
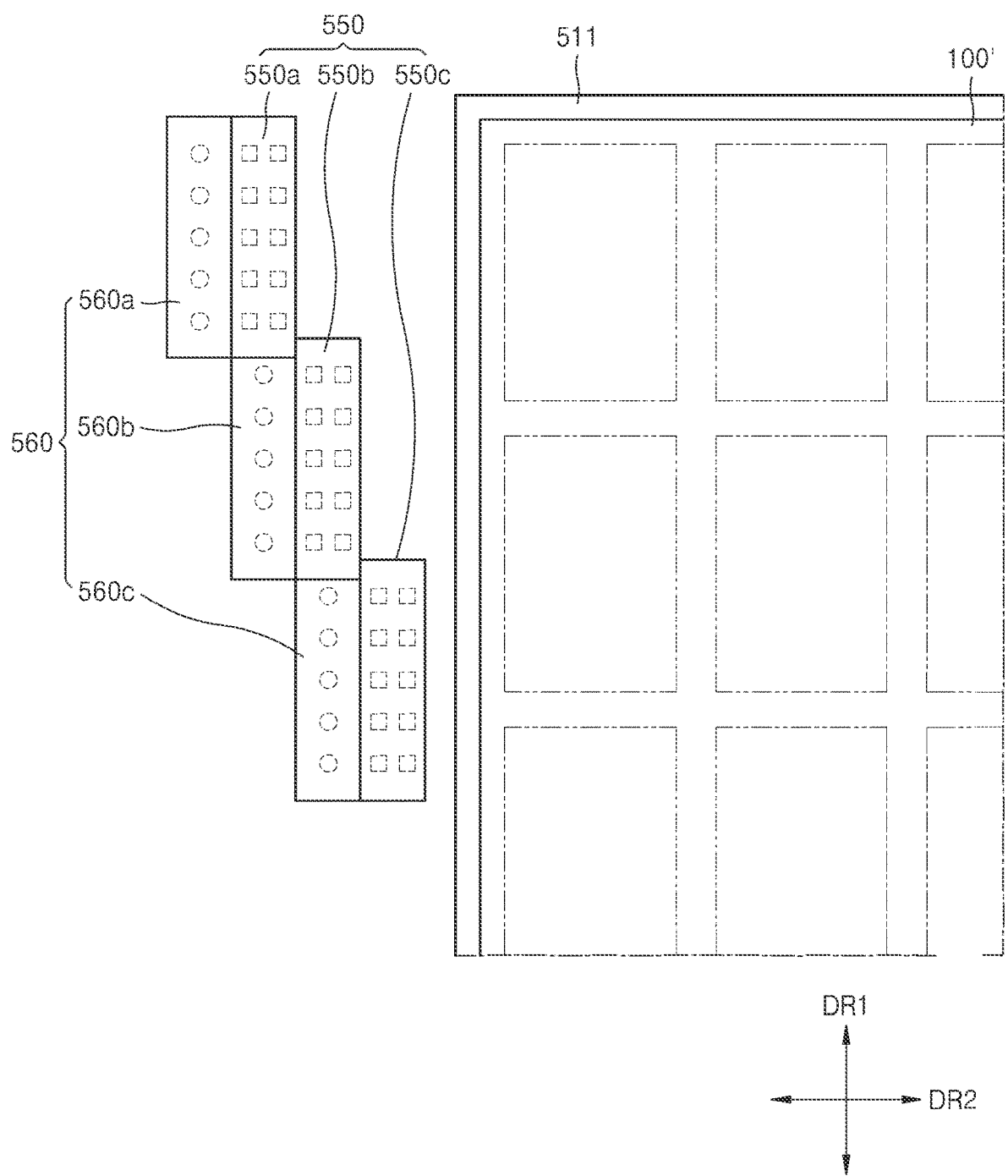
FIG. 17 is a plan view of an apparatus of manufacturing a display apparatus according to some embodiments.

FIG. 17 is a plan view of an apparatus of manufacturing a display apparatus according to some embodiments.

Referring to FIG. 17, the plurality of hardening parts 560 may be respectively adjacent to the plurality of discharge parts 550. That is, in the case where the discharge part 550 includes the first to third discharge parts 550a, 550b, and 550c, the hardening part 560 may include first to third hardening parts 560a, 560b, and 560c. Each of the hardening parts 560 may be adjacent to each of the discharge parts 550. In this case, the length of each of the plurality of hardening parts 560 in the first direction DR1 may be equal to the length of each of the plurality of discharge parts 550 in the first direction DR1.

According to some embodiments, the first to third discharge parts 550a, 550b, and 550c may be apart from each other in the second direction DR2 and may partially overlap each other in the first direction DR1, and thus, the first to third hardening parts 560a, 560b, and 560c may be apart from each other in the second direction DR2 and may partially overlap each other in the first direction DR1. Accordingly, the discharge part 550 may discharge droplets, and then, hardening may be immediately performed with a minimum time interval.

Figure 18:
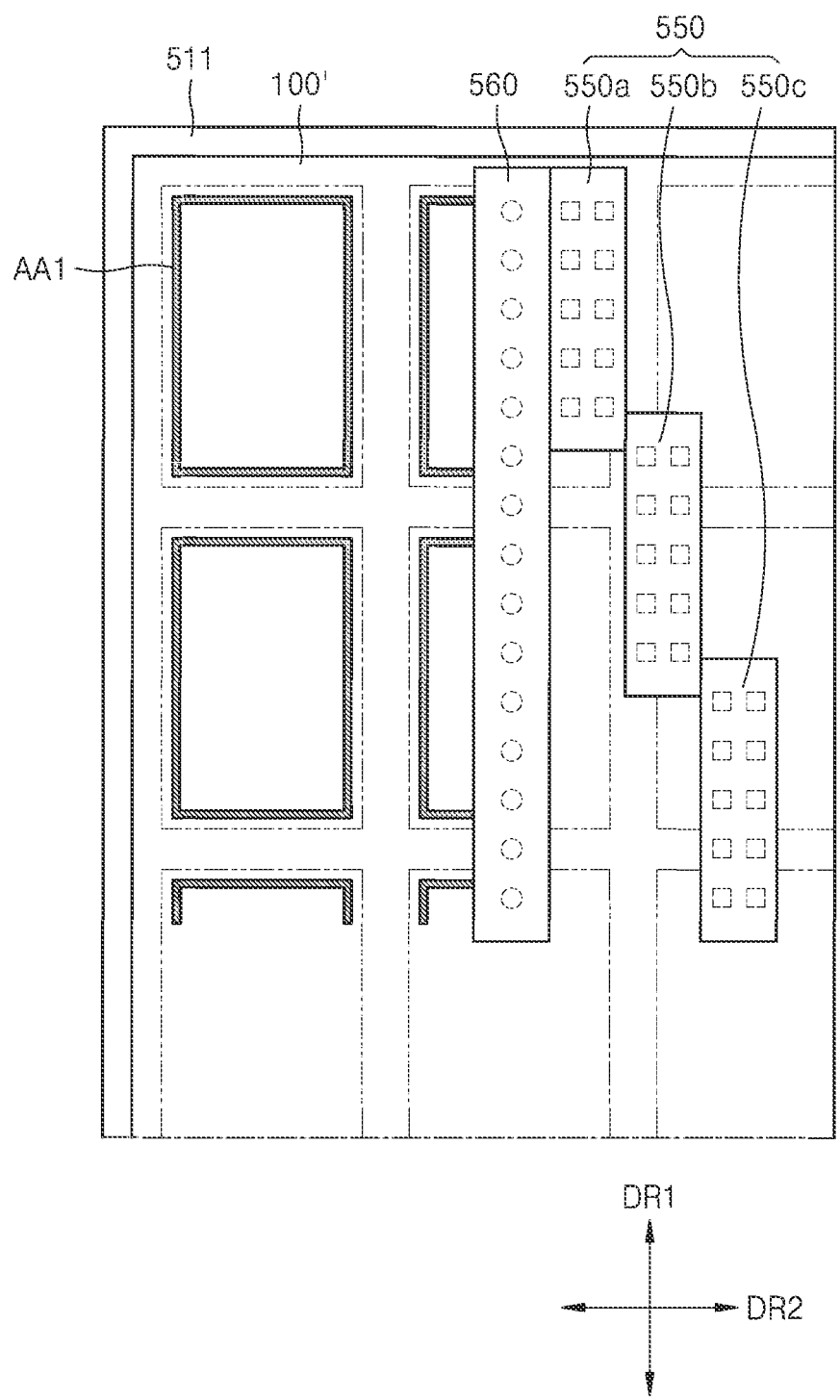
FIGS. 18 to 20 are views showing a method of manufacturing a display apparatus according to some embodiments.
Figure 19:
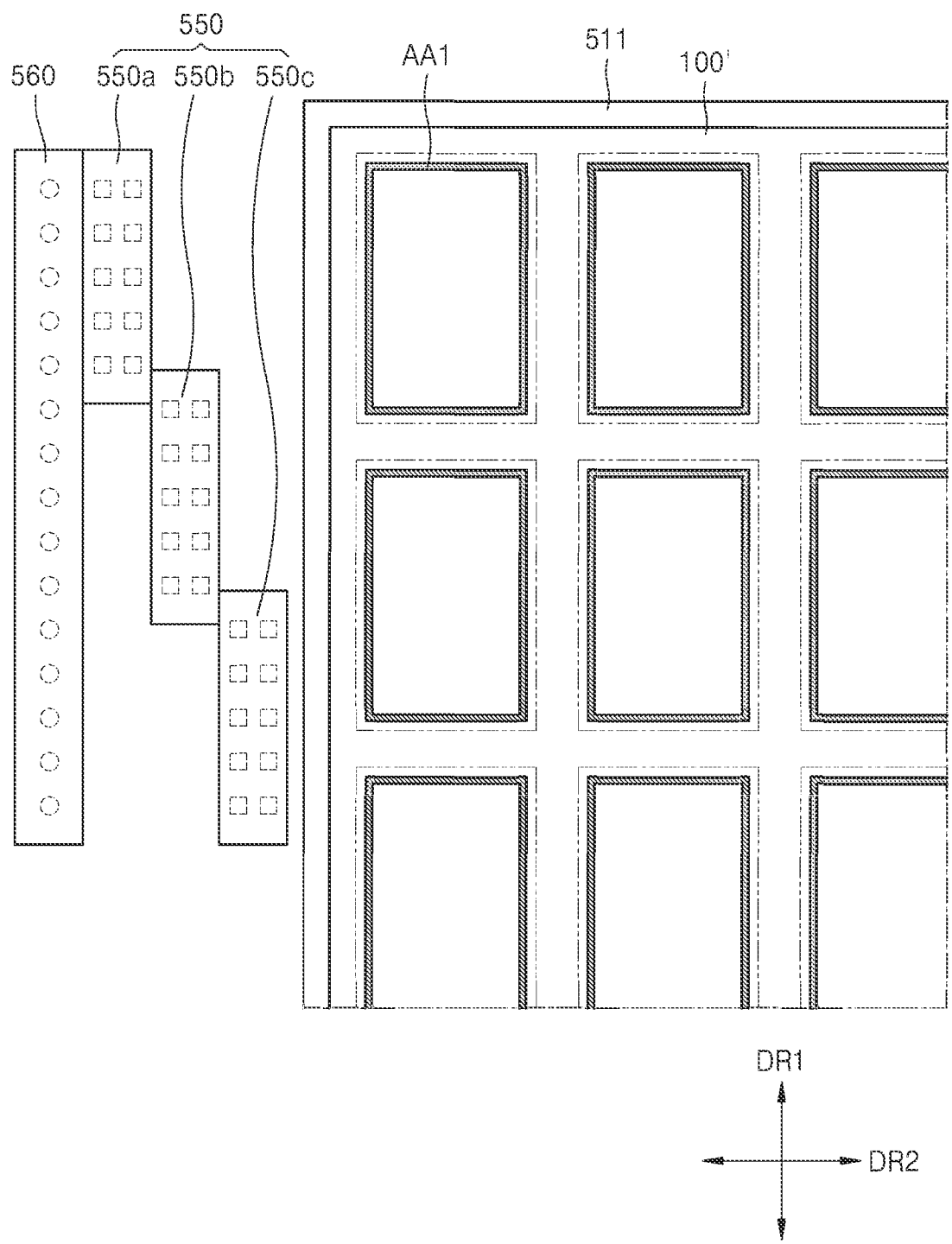
Figure 20:
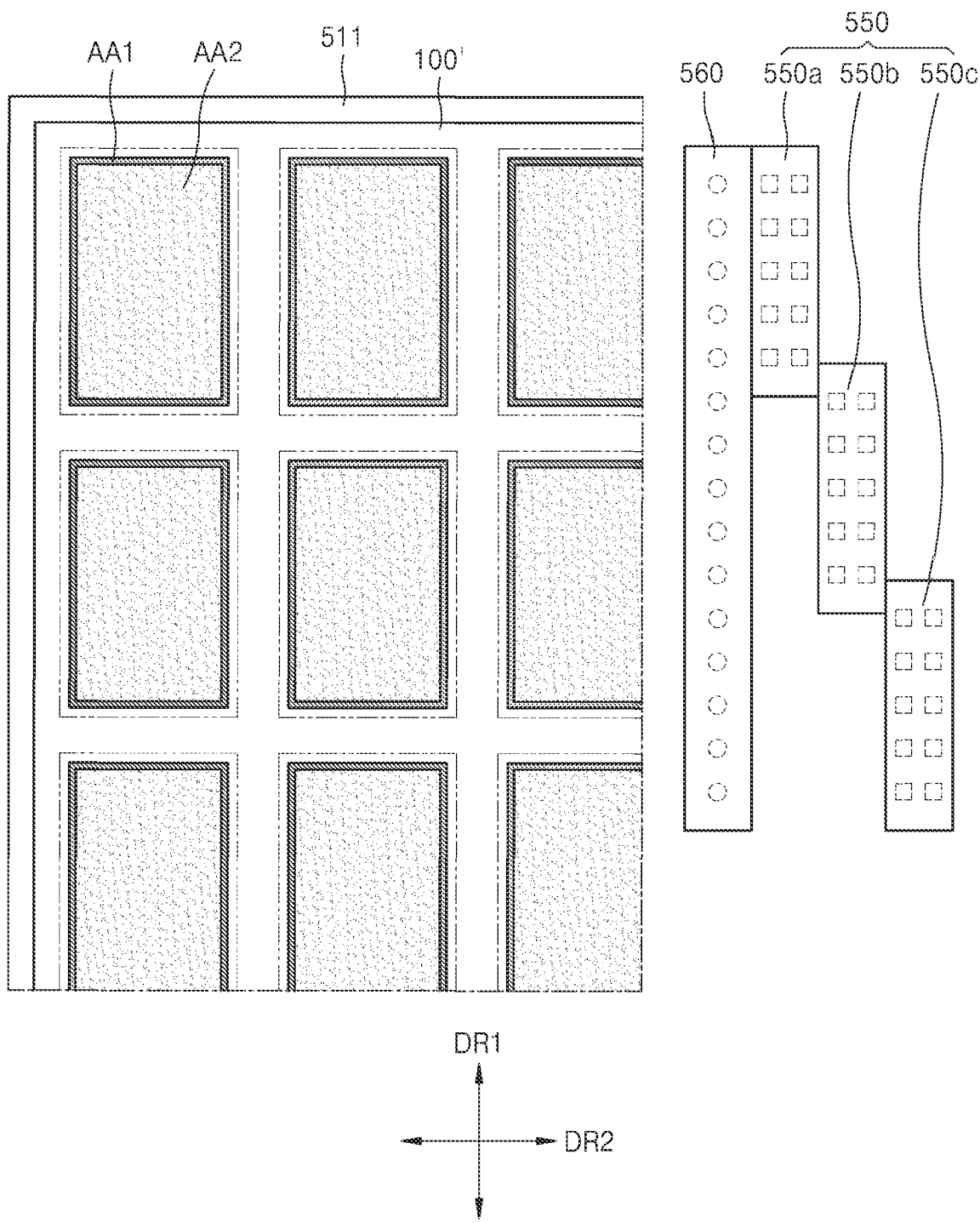

FIGS. 18 to 20 are views showing a method of manufacturing a display apparatus according to some embodiments.

A method of manufacturing a display apparatus according to some embodiments may be a method of manufacturing the display apparatus 1 described above, or a method using the apparatus 2 for manufacturing a display apparatus. However, the method is not limited thereto. In addition, because the method of manufacturing a display apparatus is similar to the method of manufacturing a display apparatus described above, differences are mainly described below.

First, referring to FIG. 15 again, the mother substrate 100' including the plurality of display substrates 100 may be arranged on the stage 511. In this case, as described above, the pixel circuit layer, the display element layer, and the first inorganic encapsulation layer may be stacked on the mother substrate 100'.

The discharge part 550 may move along the mother substrate 100' and discharge droplets while being apart in the third direction DR3 from the mother substrate 100'. Accordingly, the discharge part 550 may be configured to discharge droplets in the first region AA1 adjacent to the periphery of the display area of the display substrate 100. The discharge part 550 may discharge droplets to some of the plurality of display substrates 100 while moving in the second direction DR2 and discharge droplets to the rest of the plurality of display substrates 100 while moving again in the first direction DR1.

When the discharge part 550 discharges droplets in the first region AA1, the droplets may be immediately hardened by the hardening part 560 arranged adjacent to the discharge part 550 and moving together with the discharge part 550.

FIG. 19 shows droplet-discharging in the first region AA1 is completed. Referring to FIG. 19, after droplet-discharging in the first region AA1 is completed, the discharge part 550 and the hardening part 560 may return to a start position, that is, the position shown in FIG. 19.

Referring to FIG. 20, with the mother substrate 100' apart in the third direction DR3 again, the discharge part 550 may discharge droplets in the second region AA2 while moving across the mother substrate 100'. The discharge part 550 may discharge droplets to some of the plurality of display substrates 100 while moving in the second direction DR2 and discharge droplets to the rest of the plurality of display substrates 100 while moving again in the first direction DR1.

The hardening part 560 may be arranged adjacent to the discharge part 550 to immediately harden discharged droplets while moving together with the discharge part 550.

Accordingly, the organic encapsulation layers may be simultaneously formed on the plurality of display substrates 100. In addition, because a dam including an organic material is formed in the first region AA1, a separate dam may not be formed in the peripheral area PA, and a dead space may be reduced.

In the display apparatus and the method of manufacturing a display apparatus according to some embodiments, because the organic encapsulation layer forms a dam by itself, a separate dam for preventing reflow of the organic encapsulation layer may not be required. Accordingly, a display apparatus with a relatively reduced area of the peripheral area and a relatively extended area of the display area may be implemented.

Effects of the present disclosure are not limited to the above-mentioned effects and other effects not mentioned may be clearly understood by those of ordinary skill in the art from the following claims.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus including a display area and a peripheral area surrounding the display area, the display apparatus comprising:
a substrate;
a plurality of display elements over the substrate in the display area;
an inorganic encapsulation layer sealing the plurality of display elements; and
an organic encapsulation layer covering the inorganic encapsulation layer and including a protrusion protruding in a direction perpendicular to the plane of the substrate at an end of the organic encapsulation layer,
wherein the peripheral area comprises a first peripheral area adjacent to the display area in which a planarization layer is arranged, and a second peripheral area adjacent to the first peripheral area in which the planarization layer is not arranged,
wherein the protrusion is arranged in the first peripheral area and is not arranged in the second peripheral area such that the organic encapsulation layer is positioned within the display area and the first peripheral area.

2. The apparatus of claim 1, further comprising the planarization layer between the substrate and the inorganic encapsulation layer,
wherein the protrusion is in a region in which the planarization layer is arranged.

3. The apparatus of claim 2, wherein the organic encapsulation layer is in the region in which the planarization layer is arranged in a plan view.

4. The apparatus of claim 2, wherein a minimum distance between one surface of the substrate and the organic encapsulation layer is greater than a maximum distance between one surface of the substrate and the planarization layer.

5. The apparatus of claim 1, wherein a height of the protrusion is 3 μm or more and less than 10 μm.

6. The apparatus of claim 1, further comprising a pixel-defining layer between the substrate and the inorganic encapsulation layer,
wherein the protrusion overlaps the pixel-defining layer in a plan view.

7. The apparatus of claim 1, wherein the protrusion is around an entirety of a periphery of the display area.

8. A method of manufacturing a display apparatus, the method comprising:
forming an inorganic encapsulation layer to cover a display area and a peripheral area over a substrate including the display area in which a plurality of display elements are arranged and the peripheral area surrounding the display area; and
forming an organic encapsulation layer on the inorganic encapsulation layer,
wherein forming the organic encapsulation layer comprises:
discharging droplets on the inorganic encapsulation layer in a first region which is a partial region of the peripheral area;
hardening the droplets in the first region;
discharging droplets on the inorganic encapsulation layer in a second region which is surrounded by the first region and overlapping the display area; and
hardening the droplets in the second region.

9. The method of claim 8, further comprising:
forming a pixel-defining layer between the substrate and the inorganic encapsulation layer; and
discharging droplets such that the first region overlaps the pixel-defining layer in a plan view.

10. The method of claim 8, further comprising forming an organic encapsulation layer by hardening the droplets in the first region and the droplets in the second region.

11. The method of claim 8, wherein the first region is adjacent to a periphery of the display area.

12. The method of claim 8, further comprising forming a planarization layer between the substrate and the inorganic encapsulation layer,
wherein the first region is apart inwardly from an outer periphery of the substrate, toward a center of the substrate, to a region in which the planarization layer is arranged.

13. The method of claim 8, wherein the discharging of the droplets in the first region includes discharging the droplets such that the droplets extend around an entirety of a periphery of the display area.

14. The method of claim 8, wherein the discharging of the droplets in the first region includes moving a discharge part in one direction to discharge droplets in the first region.

15. The method of claim 14, wherein the hardening of the droplets in the first region includes hardening the droplets by using a hardening part adjacent to the discharge part.

16. The method of claim 15, wherein the hardening part moves in a same direction as a moving direction of the discharge part.

17. The method of claim 15, wherein the hardening part is arranged at a rear end of the discharge part in a moving direction thereof.

18. The method of claim 8, wherein the hardening of the droplets in the first region includes hardening the droplets by irradiating, by a hardening part, an ultraviolet ray to the droplets.

19. The method of claim 18, wherein a blocking part is provided around the hardening part and is configured to block an ultraviolet ray.

20. The method of claim 8, wherein the hardening of the droplets in the first region includes selectively irradiating an ultraviolet ray on only the first region in which the droplets are coated.

* * * * *